(12) United States Patent
Shen et al.

(10) Patent No.: US 8,966,336 B2
(45) Date of Patent: *Feb. 24, 2015

(54) SELECTIVE MERGE AND PARTIAL REUSE LDPC (LOW DENSITY PARITY CHECK) CODE CONSTRUCTION FOR LIMITED NUMBER OF LAYERS BELIEF PROPAGATION (BP) DECODING

(71) Applicant: Broadcom Corporation, Irvine, CA (US)

(72) Inventors: Ba-Zhong Shen, Irvine, CA (US); Andrew J. Blanksby, Lake Oswego, OR (US); Jason A. Trachewsky, Menlo Park, CA (US)

(73) Assignee: Broadcom Corporation, Irvine, CA (US)

( * ) Notice: Subject to any disclaimer, the term of this patent is extended or adjusted under 35 U.S.C. 154(b) by 49 days.

This patent is subject to a terminal disclaimer.

(21) Appl. No.: 13/780,372

(22) Filed: Feb. 28, 2013

(65) Prior Publication Data

US 2013/0179756 A1 Jul. 11, 2013

Related U.S. Application Data

(63) Continuation of application No. 12/561,374, filed on Sep. 17, 2009, now Pat. No. 8,392,787.

(60) Provisional application No. 61/110,479, filed on Oct. 31, 2008, provisional application No. 61/111,276, filed on Nov. 4, 2008, provisional application No. 61/173,720, filed on Apr. 29, 2009.

(51) Int. Cl.
*H03M 13/11* (2006.01)
*H03M 13/13* (2006.01)
*H03M 13/03* (2006.01)
*H03M 13/00* (2006.01)
*H04L 1/00* (2006.01)
*H03M 13/33* (2006.01)

(52) U.S. Cl.
CPC ............ *H03M 13/13* (2013.01); *H03M 13/033* (2013.01); *H03M 13/1137* (2013.01); *H03M 13/114* (2013.01); *H03M 13/116* (2013.01); *H03M 13/635* (2013.01); *H03M 13/6516* (2013.01); *H04L 1/0057* (2013.01)
USPC ........................................... 714/752; 714/800

(58) Field of Classification Search
None
See application file for complete search history.

(56) References Cited

U.S. PATENT DOCUMENTS

| 8,392,787 | B2 * | 3/2013 | Shen et al. | 714/752 |
| 2005/0229088 | A1 * | 10/2005 | Tzannes et al. | 714/800 |
| 2006/0156206 | A1 * | 7/2006 | Shen et al. | 714/784 |
| 2007/0033480 | A1 * | 2/2007 | Lee et al. | 714/758 |
| 2007/0089016 | A1 * | 4/2007 | Bhatt et al. | 714/752 |

\* cited by examiner

*Primary Examiner* — Ajay Bhatia
*Assistant Examiner* — Dipakkumar Ghandi
(74) *Attorney, Agent, or Firm* — Garlick & Markison; Shayne X. Short

(57) ABSTRACT

Selective merge and partial reuse LDPC (Low Density Parity Check) code construction for limited number of layers Belief Propagation (BP) decoding. Multiple LDPC matrices may be generated from a base code, such that multiple/distinct LDPC coded signals may be encoded and/or decoded within a singular communication device. Generally speaking, a first LDPC matrix is modified in accordance with one or more operations thereby generating a second LDPC matrix, and the second LDPC matrix is employed in accordance with encoding an information bit thereby generating an LDPC coded signal (alternatively performed using an LDPC generator matrix corresponding to the LDPC matrix) and/or decoding processing of an LDPC coded signal thereby generating an estimate of an information bit encoded therein. The operations performed on the first LDPC matrix may be any one of, or combination of, selectively merging, deleting, partially re-using one or more sub-matrix rows, and/or partitioning sub-matrix rows.

20 Claims, 31 Drawing Sheets

H matrix, rate 1/2 code (sub-matrix size: 42 x 42) ← 1200

| 24 | -  | 32 | -  | 33 | -  | 28 | -  | 23 | -  | -  | -  | -  | -  | -  | -  |
|----|----|----|----|----|----|----|----|----|----|----|----|----|----|----|----|
| 7  | 17 | -  | 21 | -  | 22 | -  | 35 | 0  | 13 | -  | -  | -  | -  | -  | -  |
| -  | -  | 10 | -  | 13 | -  | -  | 34 | -  | 16 | 40 | 21 | -  | -  | -  | -  |
| -  | 28 | -  | 27 | -  | 23 | 16 | -  | -  | -  | -  | 11 | 5  | -  | -  | -  |
| 16 | -  | 13 | -  | 11 | -  | 18 | -  | 16 | -  | 21 | -  | -  | 4  | -  | -  |
| 32 | -  | 4  | -  | -  | 5  | -  | 36 | -  | 15 | -  | -  | 13 | -  | 24 | -  |
| -  | 31 | -  | 32 | -  | 13 | -  | 15 | -  | -  | 15 | -  | -  | -  | -  | 36 |
| -  | 6  | -  | 41 | 38 | -  | 10 | -  | -  | -  | -  | 13 | -  | -  | -  | 13 |

Parity-check matrix $C_0(1/2, 42)$

Combine to 4-layers

| | | | | | | | | | | | | | | | | |
|---|---|---|---|---|---|---|---|---|---|---|---|---|---|---|---|---|
| Layer 0 | 24 | -  | 32 | -  | 33 | -  | 28 | -  | 23 | -  | -  | -  | -  | -  | -  | R0 |
|         | 7  | 17 | -  | 21 | -  | 22 | -  | 35 | 0  | 13 | -  | -  | -  | -  | -  | R2 |
| Layer 1 | -  | -  | 10 | -  | 13 | -  | -  | 34 | -  | 16 | 40 | 21 | -  | -  | -  | R1 |
|         | -  | 28 | -  | 27 | -  | 23 | 16 | -  | -  | -  | -  | 11 | 5  | -  | -  | R3 |
| Layer 2 | 16 | -  | 13 | -  | 11 | -  | 18 | -  | 16 | -  | 21 | -  | -  | 4  | -  | R4 |
|         | 32 | -  | 4  | -  | -  | 5  | -  | 36 | -  | 15 | -  | -  | 13 | -  | 24 | R6 |
| Layer 3 | -  | 31 | -  | 32 | -  | 13 | -  | 15 | -  | -  | 15 | -  | -  | -  | -  | R5 |
|         | -  | 6  | -  | 41 | 38 | -  | 10 | -  | -  | -  | -  | 13 | -  | -  | 36 | R7 |

Fig. 12

Fig. 13 rate 1/2 code performance (QPSK Rayleigh Fading)

Fig. 15  rate 5/8 code performance (QPSK Rayleigh Fading)

H matrix, rate 3/4 code (sub-matrix size: 42 x 42)

1600

|  |  |  |  |  |  |  |  |  |  |  |  |  |  |  |  |
|---|---|---|---|---|---|---|---|---|---|---|---|---|---|---|---|
| Layer0 | 20 | 36 | 36 | 22 | 32 | 18 | 4 | 22 | 6 | 36 | 19 | 25 | 0 | - | - | - |
| Layer1 | 16 | 25 | 15 | 36 | 24 | 17 | 11 | 6 | 33 | 10 | 17 | 29 | 0 | 0 | - | - |
| Layer2 | 5 | 2 | 37 | 31 | 18 | 29 | 41 | 39 | 16 | 18 | 31 | 22 | 15 | 0 | 0 | - |
| Layer3 | 28 | 9 | 10 | 19 | 28 | 31 | 13 | 17 | 8 | 16 | 13 | 15 | 5 | 16 | 0 | 0 |

Parity-check matrix $C_0(3/4, 42, 0\%)$

Fig. 16

Fig. 17 rate 3/4 code performance (QPSK Rayleigh Fading)

Parity-check matrix $C_1(1/2,42)$

| 28 | - | - | 31 | - | 16 | - | 8 | - | 24 | - | - | - | - |
|---|---|---|---|---|---|---|---|---|---|---|---|---|---|
| 40 | - | 28 | - | 34 | - | 3 | - | - | - | 17 | - | - | - |
| - | 13 | - | 35 | - | 25 | - | - | 14 | 25 | - | 22 | - | - |
| - | - | - | - | - | - | 17 | - | 28 | - | 22 | - | 28 | - |
| 16 | - | 29 | - | 25 | - | 15 | - | - | - | - | 35 | - | 25 | - |
| 23 | - | - | 17 | - | - | - | 39 | - | 36 | - | 39 | - | - | - | 28 | - |
| - | 20 | - | - | 8 | - | - | 6 | - | 26 | - | 10 | - | - | 25 | 27 | 30 | 23 |
| - | 24 | - | - | 27 | - | 40 | - | 41 | - | - | - | 33 | - | 8 | - | - | - | 39 |

Combine to 4-layers

| Layer 0 | 28 | - | - | 31 | - | 16 | - | 8 | - | 24 | - | - | - | - | - | - | - | R0 |
| | 40 | - | 28 | - | 34 | - | 3 | - | - | - | 17 | - | 22 | - | 28 | - | - | R2 |
| Layer 1 | - | 13 | - | 35 | - | 25 | - | - | 14 | 25 | - | 22 | - | 35 | - | - | - | R1 |
| | - | - | - | - | - | - | 17 | - | 28 | - | - | - | 28 | - | - | - | - | R3 |
| Layer 2 | 16 | - | 29 | - | 25 | - | 15 | - | - | 39 | - | - | - | - | - | - | - | R4 |
| | 23 | - | - | 17 | - | - | - | 39 | - | 36 | - | 37 | - | 33 | - | 25 | 27 | 30 | 23 | R6 |
| Layer 3 | - | 20 | - | - | 8 | - | - | 6 | - | 26 | - | 10 | - | - | - | - | - | - | R5 |
| | - | 24 | - | - | 27 | - | 40 | - | 41 | - | - | - | - | 8 | - | - | - | 39 | R7 | full re-use of rate 1/2 H matrix

Fig. 21

Fig. 23    re-use of $C_1(1/2,42)$ in rate 5/8 H matrix

$C_1(1/2,42)$ — matrix 2300

| | | | | | | | | | | | | | | | | | | | | | | | | |
|---|---|---|---|---|---|---|---|---|---|---|---|---|---|---|---|---|---|---|---|---|---|---|---|---|
| 28 | - | - | - | 16 | - | - | - | - | - | 22 | - | - | - | 24 | - | 22 | - | - | - | - | - | - | - | R0 |
| - | 28 | 31 | 34 | - | - | - | - | 24 | - | - | 22 | - | - | - | 17 | - | - | - | - | - | - | - | - | R2 |
| 40 | - | - | - | - | 17 | 8 | 28 | - | 22 | 35 | 28 | - | - | 25 | - | - | - | - | - | - | - | - | - | R1 |
| - | - | 35 | - | 3 | - | 40 | - | 25 | 17 | - | - | 28 | - | - | - | - | - | - | - | - | - | - | - | R3 |
| - | - | - | - | - | 25 | - | 14 | - | - | - | - | 5 | 0 | - | - | - | 28 | - | - | - | - | - | - | R4 |
| 16 | 20 | 29 | 8 | 15 | - | 36 | - | 39 | - | 33 | - | - | 27 | - | - | - | - | 30 | - | - | - | - | - | R6 |
| - | - | - | - | - | 6 | - | 37 | - | 10 | - | 8 | 25 | 40 | - | - | - | - | - | 23 | - | - | - | - | R5 |
| 23 | 24 | 17 | 27 | 40 | 39 | 41 | 26 | - | - | - | - | - | - | - | - | - | - | 39 | - | - | - | - | - | R7 |

⇒ $C_1(5/8,42,100\%)$

| | | | | | | | | | | | | | | | | |
|---|---|---|---|---|---|---|---|---|---|---|---|---|---|---|---|---|
| 28 | - | - | - | 16 | - | - | - | - | - | 22 | - | - | - | 24 | - | 22 | R0+R2 |
| - | 13 | 29 | 25 | - | 25 | 40 | 14 | 39 | - | 35 | 28 | - | - | - | 17 | - | R3 |
| 40 | - | 35 | - | 3 | 17 | - | 28 | 25 | 22 | - | - | 28 | - | 25 | - | - | R4 |
| 16 | - | - | - | 15 | - | 36 | - | - | 17 | - | - | 5 | 0 | - | - | - | R1 |
| - | 20 | - | 8 | - | 6 | - | 37 | - | 10 | 33 | - | - | 27 | - | - | - | R6 |
| 23 | 24 | - | 27 | - | 39 | 41 | 26 | - | - | - | 8 | 25 | 40 | - | - | - | R5+R7 |

Layer 0, Layer 1, Layer 2, Layer 3

Fig. 25 re-use of every column of $C_1(1/2,42)$ in rate 3/4 H matrix

Fig. 27 performance comparison, 3 different re-used codes (QPSK Rayleigh Fading)

Re-Using every column of $C_1(3/4,42,100\%)$ to obtain 13/16 Code $C_1(3/4,42,100\%)$

| 28 | 28 | 31 | 34 | 16 | 17 | 8  | 28 | 24 | 22 | 22 | 7  | 19 | -  | -  |
| 40 | 13 | 35 | 25 | 3  | 25 | 40 | 14 | 25 | 17 | 35 | 22 | 33 | -  | -  |
| 16 | 20 | 29 | 8  | 15 | 6  | 36 | 37 | 39 | 19 | 33 | 28 | 28 | 17 | -  |
| 23 | 24 | 17 | 27 | 40 | 39 | 41 | 26 | 40 | 10 | -  | 8  | 25 | 27 | 30 |
|    |    |    |    |    |    |    |    |    |    |    |    |    | 40 | 23 |
|    |    |    |    |    |    |    |    |    |    |    |    |    |    | 39 |

$C_1(13/16,42,100\%)$

| Layer 0  | 40 | 13 | 35 | 25 | 3  | 25 | 40 | 14 | 25 | 17 | 35 | 22 | 33 | -  | -  | -  | R1    |
| Layer 1,2| 16 | 20 | 29 | 8  | 15 | 6  | 36 | 37 | 39 | 19 | 33 | 28 | 28 | 17 | 27 | 30 | R0+R2 |
|          | 28 | 28 | 31 | 34 | 16 | 17 | 8  | 28 | 24 | 22 | 22 | 7  | 19 |    |    |    |       |
| Layer 3  | 23 | 24 | 17 | 27 | 40 | 39 | 41 | 26 | 40 | 10 | -  | 8  | 25 | 40 | 23 | 39 | R3    |

Fig. 29

SELECTIVE MERGE AND PARTIAL REUSE LDPC (LOW DENSITY PARITY CHECK) CODE CONSTRUCTION FOR LIMITED NUMBER OF LAYERS BELIEF PROPAGATION (BP) DECODING

CROSS REFERENCE TO RELATED PATENTS/PATENT APPLICATIONS

Continuation Priority Claim, 35 U.S.C. §120

The present U.S. Utility patent application claims priority pursuant to 35 U.S.C. §120, as a continuation, to the following U.S. Utility patent application which is hereby incorporated herein by reference in its entirety and made part of the present U.S. Utility patent application for all purposes:

1. U.S. Utility patent application Ser. No. 12/561,374, entitled "Selective merge and partial reuse LDPC (Low Density Parity Check) code construction for limited number of layers Belief Propagation (BP) decoding,", filed Sep. 17, 2009, currently pending, and scheduled subsequently to be issued as U.S. Pat. No. 8,392,787 on Mar. 5, 2013 (as indicated in an ISSUE NOTIFICATION mailed from the USPTO on Feb. 13, 2013), which claims priority pursuant to 35 U.S.C. §119(e) to the following U.S. Provisional Patent Applications which are hereby incorporated herein by reference in their entirety and made part of the present U.S. Utility patent application for all purposes:

1.1. U.S. Provisional Application Ser. No. 61/110,479, entitled "Selective merge and partial reuse LDPC (Low Density Parity Check) code construction for limited number of layers Belief Propagation (BP) decoding,", filed Oct. 31, 2008.

1.2. U.S. Provisional Application Ser. No. 61/111,276, entitled "Selective merge and partial reuse LDPC (Low Density Parity Check) code construction for limited number of layers Belief Propagation (BP) decoding,", filed Nov. 4, 2008.

1.3. U.S. Provisional Application Ser. No. 61/173,720, entitled "Selective merge and partial reuse LDPC (Low Density Parity Check) code construction for limited number of layers Belief Propagation (BP) decoding,", filed Apr. 29, 2009.

BACKGROUND OF THE INVENTION

1. Technical Field of the Invention

The invention relates generally to communication systems; and, more particularly, it relates to the use of LDPC (Low Density Parity Check) coded signals within such communication systems.

2. Description of Related Art

Data communication systems have been under continual development for many years. One such type of communication system that has been of significant interest lately is a communication system that employs iterative error correction codes (ECCs). Of particular interest is a communication system that employs LDPC (Low Density Parity Check) code. Communications systems with iterative codes are often able to achieve lower bit error rates (BER) than alternative codes for a given signal to noise ratio (SNR).

A continual and primary directive in this area of development has been to try continually to lower the SNR required to achieve a given BER within a communication system. The ideal goal has been to try to reach Shannon's limit in a communication channel. Shannon's limit may be viewed as being the data rate to be used in a communication channel, having a particular SNR, that achieves error free transmission through the communication channel. In other words, the Shannon limit is the theoretical bound for channel capacity for a given modulation and code rate.

LDPC code has been shown to provide for excellent decoding performance that can approach the Shannon limit in some cases. For example, some LDPC decoders have been shown to come within 0.3 dB (decibels) from the theoretical Shannon limit. While this particular example was achieved using an irregular LDPC code with a length of one million (i.e., 1,000,000), it nevertheless demonstrates the very promising application of LDPC codes within communication systems.

The use of LDPC coded signals continues to be explored within many newer application areas. For any of these particular communication system application areas, near-capacity achieving error correction codes are very desirable. The latency constraints, which would be involved by using traditional concatenated codes, simply preclude their use in such communication systems requiring or desiring very high data rate communications.

Generally speaking, within the context of communication systems that employ LDPC codes, there is a first communication device at one end of a communication channel with encoder capability and second communication device at the other end of the communication channel with decoder capability. In many instances, one or both of these two communication devices includes encoder and decoder capability (e.g., within a bi-directional communication system). LDPC codes can be applied in a variety of additional applications as well, including those that employ some form of data storage (e.g., hard disk drive (HDD) applications and other memory storage devices) in which data is encoded before writing to the storage media, and then the data is decoded after being read/retrieved from the storage media.

BRIEF DESCRIPTION OF THE SEVERAL VIEWS OF THE DRAWINGS

FIG. 12 illustrates an embodiment of processing an LDPC matrix, having code rate of 1/2 and sub-matrix size of 42×42, to generate a limited number of layers (e.g., 4) for subsequent decoding (e.g., using Belief Propagation (BP) decoding).

FIG. 16 illustrates an embodiment of processing an LDPC matrix, having code rate of 3/4 and sub-matrix size of 42×42, that undergoes sub-matrix row/layer partitioning to generate a limited number of layers (e.g., 4) for subsequent decoding (e.g., using BP decoding).

FIG. 21 illustrates an embodiment of LDPC matrix processing involving full reuse of sub-matrices of an original LDPC matrix.

FIG. 23 illustrates an embodiment of LDPC matrix processing involving selective sub-matrix row merging and selective addition/modification of sub-matrices of an original LDPC matrix.

FIG. 29 illustrates an alternative embodiment of LDPC matrix processing involving full sub-matrix reuse that involves sub-matrix row merging and reordering of sub-matrices of an original LDPC matrix.

DETAILED DESCRIPTION OF THE INVENTION

Communication systems have been around for some time, and their presence in modern life is virtually ubiquitous (e.g., television communication systems, telecommunication systems including wired and wireless communication systems, fiber-optic communication systems, combination communication systems in which part is wireless, part is wired, part is fiber-optic, etc.). As these communication systems continue to be developed, there is an ever present need for designing various means by which information may be encoded for transmitting from a first location to a second location. In accordance with this, error correction codes (ECCs) are a critical component in ensuring that the information received at the second location is actually the information sent from the first location. LDPC (Low Density Parity Check) codes are one such type of ECC that can be employed within any of a variety of communication systems.

It is noted that any of the following embodiments and approaches described herein are applicable regardless of any overall LDPC decoder architecture which may be employed, e.g., whether fully parallel, partially parallel, or serial in a particular architecture/hardware implementation.

Figure 1:
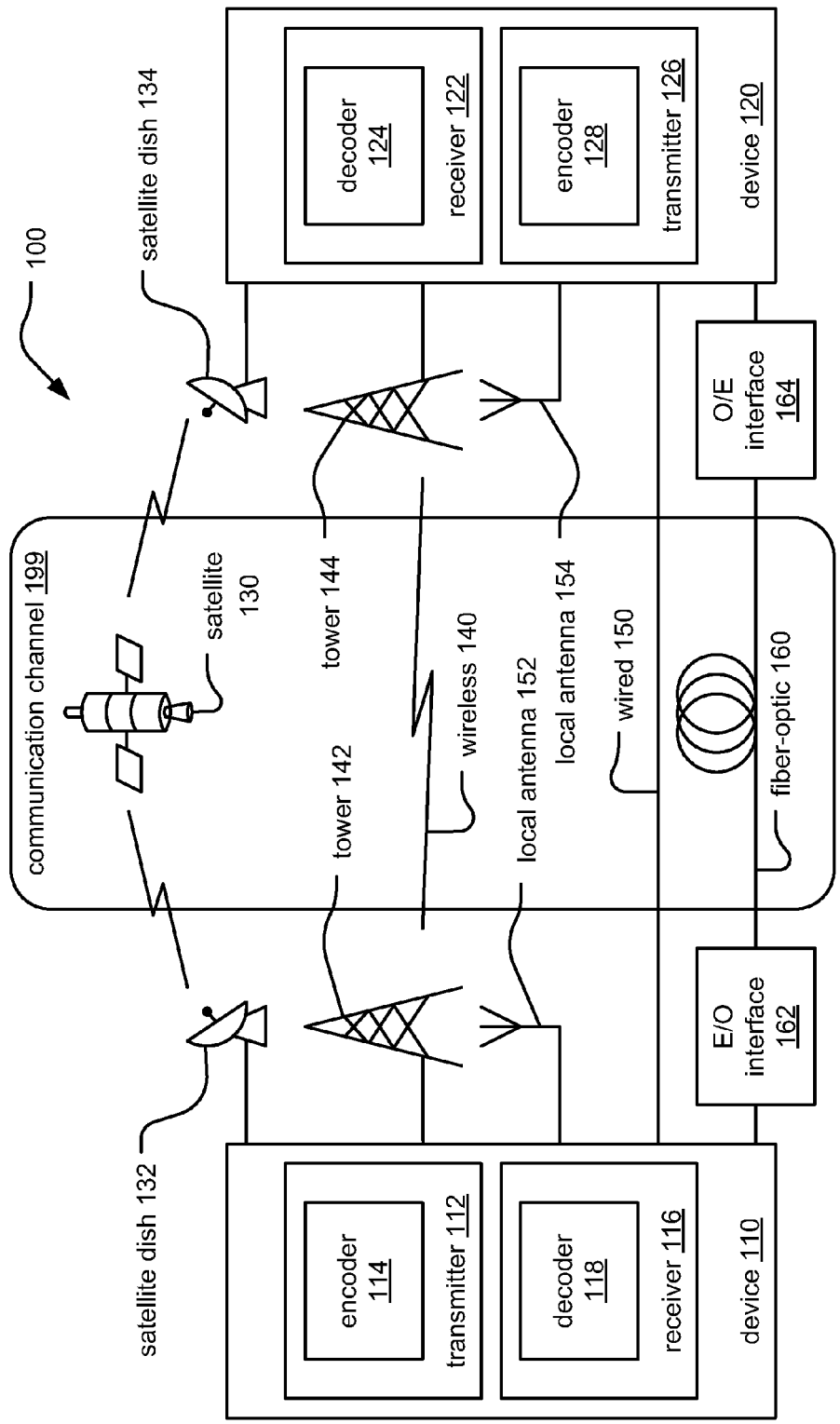
FIG. 1 and FIG. 2 illustrate various embodiments of communication systems.

The goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wired, wireless, fiber, copper, and other types of media as well.

Figure 2:
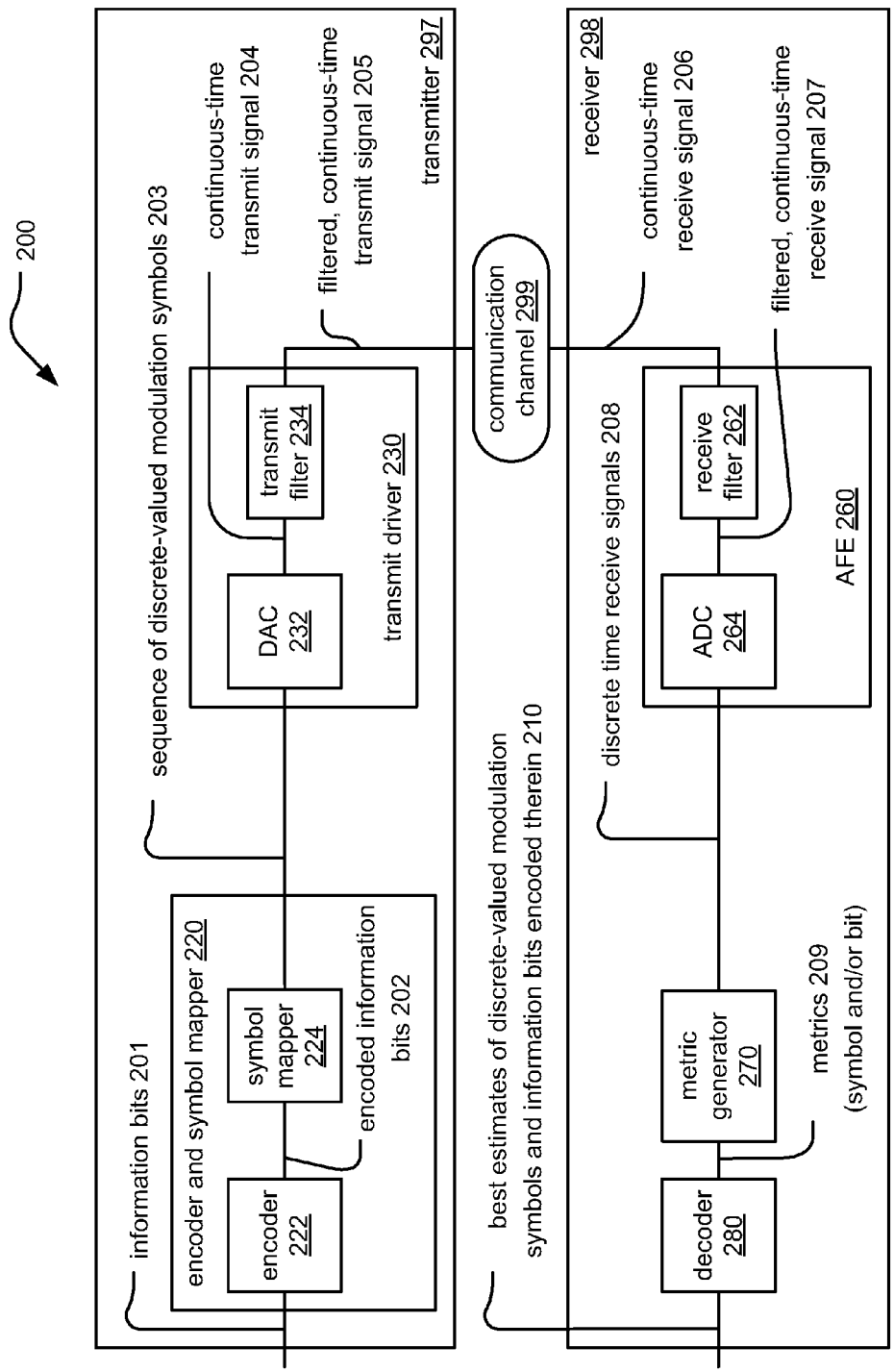

FIG. 1 and FIG. 2 are diagrams illustrate various embodiments of communication systems, 100 and 200, respectively.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

To reduce transmission errors that may undesirably be incurred within a communication system, error correction and channel coding schemes are often employed. Generally, these error correction and channel coding schemes involve the use of an encoder at the transmitter and a decoder at the receiver.

Any of the various types of LDPC codes described herein can be employed within any such desired communication system (e.g., including those variations described with respect to FIG. 1), any information storage device (e.g., hard disk drives (HDDs), network information storage devices and/or servers, etc.) or any application in which information encoding and/or decoding is desired.

Referring to the communication system 200 of FIG. 2, at a transmitting end of a communication channel 299, information bits 201 are provided to a transmitter 297 that is operable to perform encoding of these information bits 201 using an encoder and symbol mapper 220 (which may be viewed as being distinct functional blocks 222 and 224, respectively) thereby generating a sequence of discrete-valued modulation symbols 203 that is provided to a transmit driver 230 that uses a DAC (Digital to Analog Converter) 232 to generate a continuous-time transmit signal 204 and a transmit filter 234 to generate a filtered, continuous-time transmit signal 205 that substantially comports with the communication channel 299. At a receiving end of the communication channel 299, continuous-time receive signal 206 is provided to an AFE (Analog Front End) 260 that includes a receive filter 262 (that generates a filtered, continuous-time receive signal 207) and an ADC (Analog to Digital Converter) 264 (that generates discrete-time receive signals 208). A metric generator 270 calculates metrics 209 (e.g., on either a symbol and/or bit basis) that are employed by a decoder 280 to make best estimates of the discrete-valued modulation symbols and information bits encoded therein 210.

The decoders of either of the previous embodiments may be implemented to include various aspects and/or embodiment of the invention therein. In addition, several of the following Figures describe other and particular embodiments (some in more detail) that may be used to support the devices, systems, functionality and/or methods that may be implemented in accordance with certain aspects and/or embodiments of the invention. One particular type of signal that is processed according to certain aspects and/or embodiments of the invention is an LDPC coded signal. Before more details are provided below, a general description of LDPC codes is provided.

Figure 3:
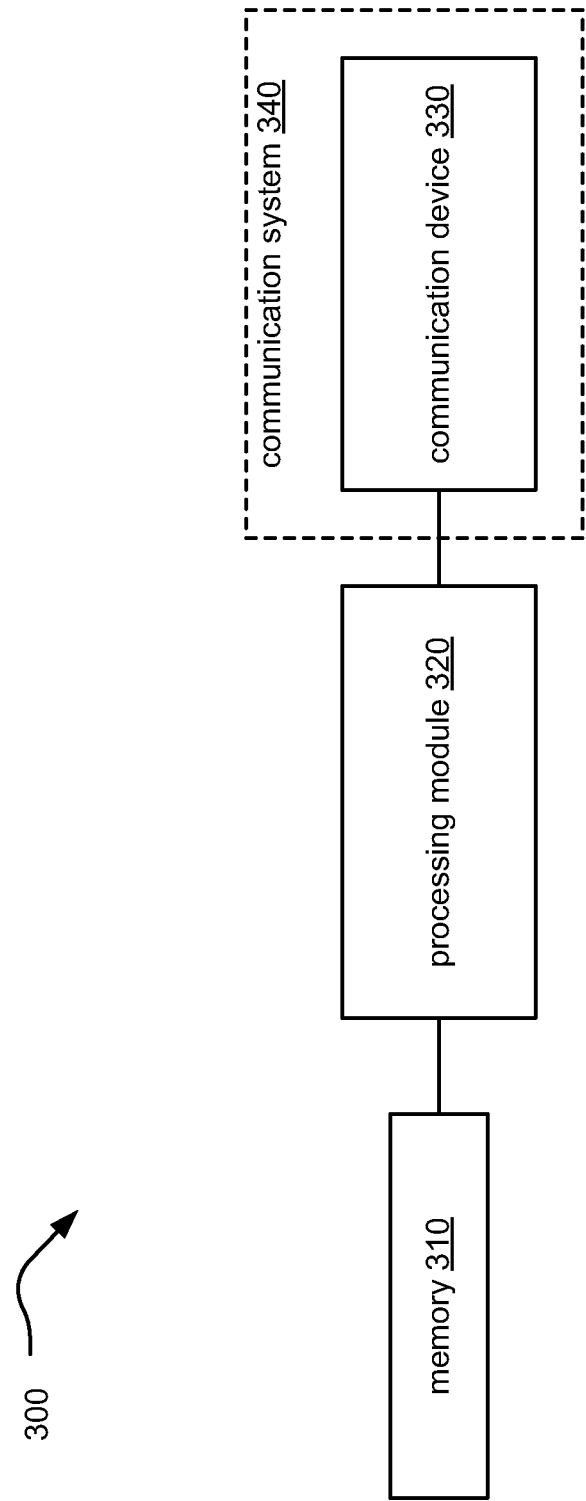
FIG. 3 illustrates an embodiment of an apparatus that is operable to perform LDPC decoding processing and/or LDPC code construction.

FIG. 3 illustrates an embodiment of an apparatus 300 that is operable to perform LDPC decoding processing and/or LDPC code construction. The apparatus 300 includes a processing module 320, and a memory 310. The memory 310 is coupled to the processing module, and the memory 310 is operable to store operational instructions that enable the processing module 320 to perform a variety of functions. The processing module 320 is operable to perform and/or direct the manner in which various LDPC codes may be constructed in accordance with any embodiment described herein, or any equivalent thereof.

The processing module 320 can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 310 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 320 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

If desired in some embodiments, the manner in which LDPC code construction is to be performed (e.g., the size of sub-matrices within the LDPC matrix of a corresponding LDPC code, the number of all-zero-valued sub-matrices, the cyclic shift (if any) of any sub-matrix within an LDPC matrix, etc.) can be provided from the apparatus 300 to a communication system 340 that is operable to employ and perform LDPC coding using a desired LDPC code. For example, information corresponding to the LDPC code being used (e.g., the parity check matrix of the LDPC code) can also be provided from the processing module 320 to any of a variety of communication devices 330 implemented within any desired such communication system 340 as well.

If desired, the apparatus 320 can be designed to generate multiple means of constructing LDPC codes in accordance with multiple needs and/or desires as well. In some embodiments, the processing module 320 can selectively provide different information (e.g., corresponding to different LDPC codes and their corresponding LDPC matrices, relative performance comparison between the various LDPC codes, etc.) to different communication devices and/or communication systems. That way, different communication links between different communication devices can employ different LDPC codes and/or means by which to perform LDPC encoding and/or decoding. Clearly, the processing module 320 can also provide the same information to each of different communication devices and/or communication systems as well without departing from the scope and spirit of the invention.

Figure 4:
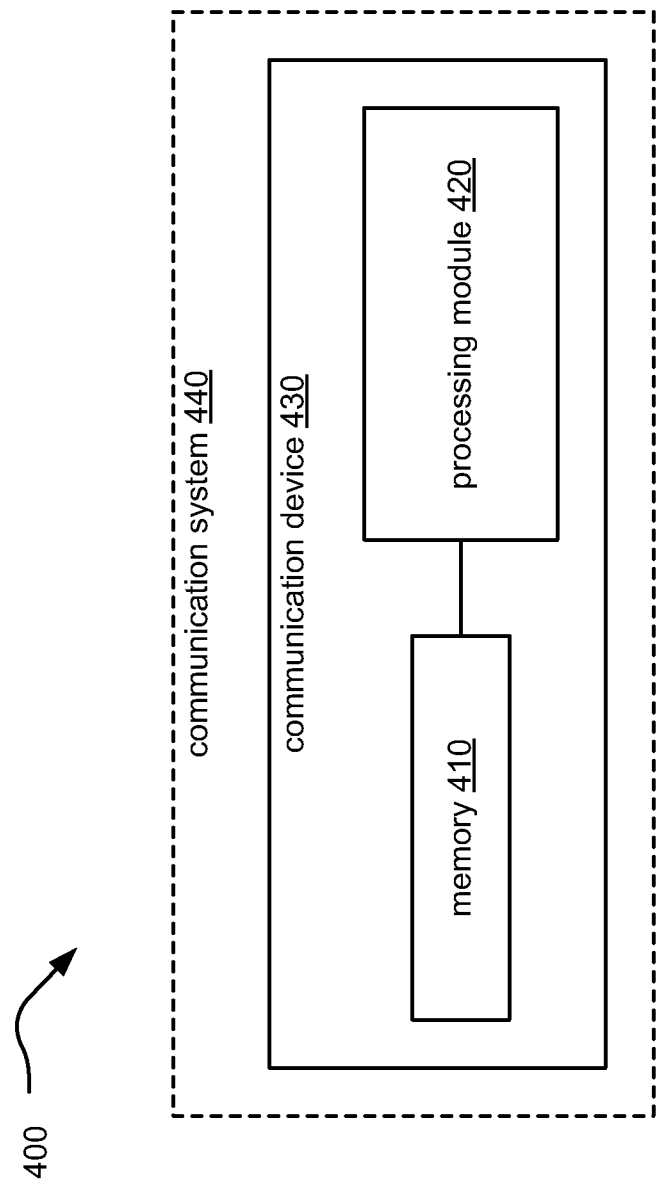
FIG. 4 illustrates an alternative embodiment of an apparatus that is operable to perform LDPC decoding processing and/or LDPC code construction.

FIG. 4 illustrates an alternative embodiment of an apparatus that is operable to perform LDPC decoding processing and/or LDPC code construction. The apparatus 400 includes a processing module 420, and a memory 410. The memory 410 is coupled to the processing module, and the memory 410 is operable to store operational instructions that enable the processing module 420 to perform a variety of functions. The processing module 420 (serviced by the memory 410) can be implemented as an apparatus capable to perform any of the functionality of any of the various modules and/or functional blocks described herein. For example, the processing module 420 (serviced by the memory 410) can be implemented as an apparatus capable to perform and/or direct the manner in which LDPC code construction is to be performed in accordance with any embodiment described herein, or any equivalent thereof.

The processing module 420 can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 410 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 420 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

If desired in some embodiments, the apparatus 400 can be any of a variety of communication devices 430, or any part or portion of any such communication device 430. Any such communication device that includes the processing module 420 and/or memory 410 can be implemented within any of a variety of communication systems 440 as well. It is also noted that various embodiments of LDPC decoding processing in accordance with LDPC decoding processing as presented herein, and equivalents thereof, may be applied to many types of communication systems and/or communication devices.

Figure 5:
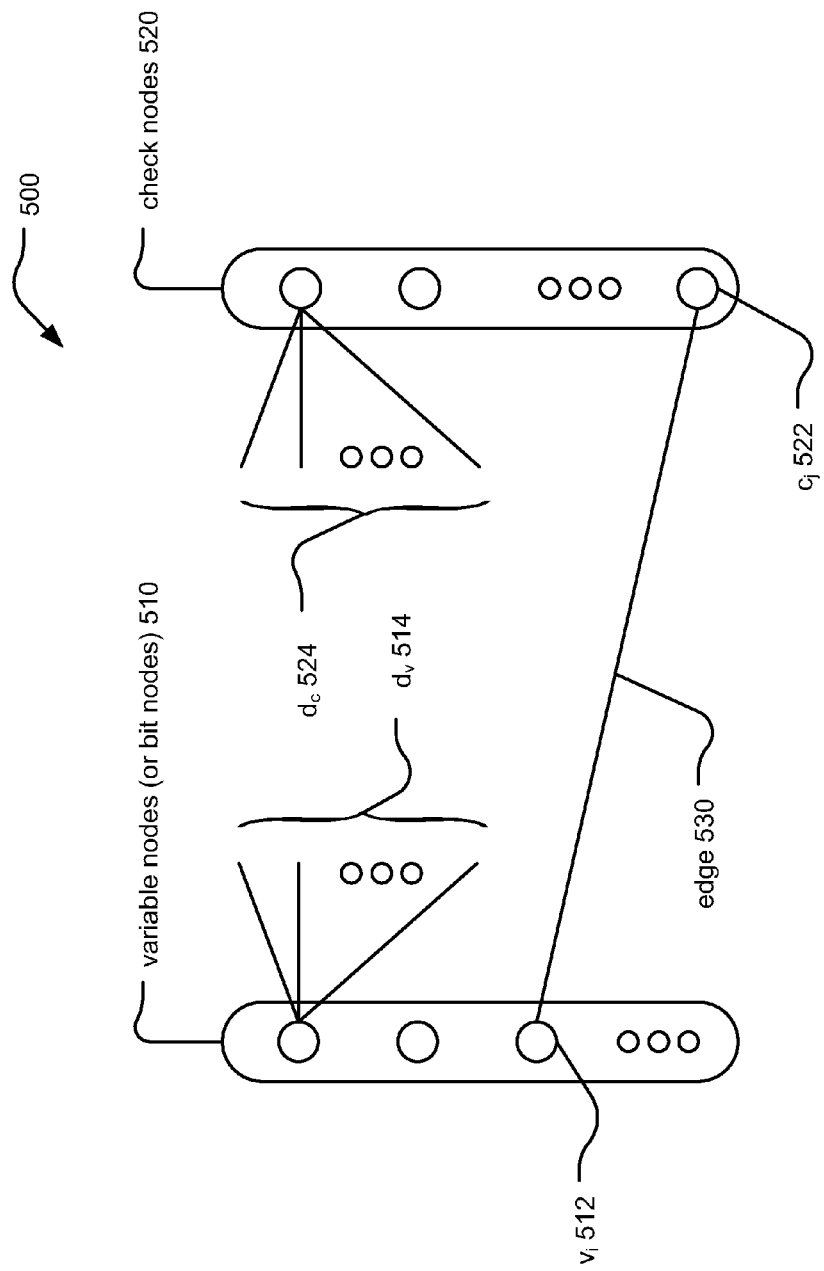
FIG. 5 illustrates an embodiment of an LDPC (Low Density Parity Check) code bipartite graph.

FIG. 5 illustrates an embodiment of an LDPC (Low Density Parity Check) code bipartite graph 500. In the art, an LDPC bipartite graph may also sometimes be referred to as a "Tanner" graph. An LDPC code may be viewed as being a code having a binary parity check matrix such that nearly all of the elements of the matrix have values of zeroes (e.g., the binary parity check matrix is sparse). For example, $H=(h_{i,j})_{M \times N}$ may be viewed as being a parity check matrix of an LDPC code with block length N.

LDPC codes are linear block codes and hence the set of all codewords $x \in C$ spans the null space of a parity check matrix, H.

$$Hx^T = 0, \forall x \in C \quad (1)$$

For LDPC codes, H, is a sparse binary matrix of dimension m×n. Each row of H corresponds to a parity check and a set element indicates that data symbol j participates in parity check i. Each column of H corresponds to a codeword symbol.

For each codeword x there are n symbols of which m are parity symbols. Hence the code rate r is given by:

$$r = (n-m)/n \quad (2)$$

The row and column weights are defined as the number of set elements in a given row or column of H, respectively. The set elements of H are chosen to satisfy the performance requirements of the code. The number of 1's in the i-th column of the parity check matrix, H, may be denoted as $d_v(i)$, and the number of 1's in the j-th row of the parity check matrix may be denoted as $d_c(j)$. If $d_v(i)=d_v$ for all i, and $d_c(j)=d_c$ for all j, then the LDPC code is called a $(d_v, d_c)$ regular LDPC code, otherwise the LDPC code is called an irregular LDPC code.

LDPC codes were introduced by R. Gallager in [1] referenced below (also in [2] referenced below) and by M. Luby et al. in [3] also referenced below.

[1] R. Gallager, *Low-Density Parity-Check Codes*, Cambridge, Mass.: MIT Press, 1963.

[2] R. G. Gallager, "Low density parity check codes," IRE Trans. Info. Theory, vol. IT-8, January 1962, pp. 21-28.

[3] M. G. Luby, M. Mitzenmacher, M. A. Shokrollahi, D. A. Spielman, and V. Stemann, "Practical Loss-Resilient Codes," *Proc. 29th Symp. on Theory of Computing*, 1997, pp. 150-159.

A regular LDPC code can be represented as a bipartite graph 500 by its parity check matrix with left side nodes representing variable of the code bits (or alternatively as the "variable nodes" (or "bit nodes") 510 in a bit decoding approach to decoding LDPC coded signals), and the right side nodes representing check equations (or alternatively as the "check nodes" 520). The bipartite graph 500 (or sometimes referred to as a Tanner graph 500) of the LDPC code defined by H may be defined by N variable nodes (e.g., N bit nodes) and M check nodes. Every variable node of the N variable nodes 510 has exactly $d_v(i)$ edges (an example edge shown using reference numeral 530) connecting the bit node, $v_i$ 512, to one or more of the check nodes (within the M check nodes). The edge 530 is specifically shown as connecting from the bit node, $v_i$ 512, to the check node, $c_j$ 522. This number of $d_v$ edges (shown as $d_v$ 514) may be referred to as the degree of a variable node i. Analogously, every check node of the M check nodes 520 has exactly $d_c(j)$ edges (shown as $d_c$ 524) connecting this node to one or more of the variable nodes (or bit nodes) 510. This number of edges, $d_c$, may be referred to as the degree of the check node j.

An edge 530 between a variable node $v_i$ (or bit node $b_i$) 512 and check node $c_j$ 522 may be defined by e=(i, j). However, on the other hand, given an edge e=(i, j), the nodes of the edge may alternatively be denoted as by e=(v(e),c(e)) (or e=(b(e), c(e))). Alternatively, the edges in the graph correspond to the set elements of H where a set element $h_{ji}$ indicates that an edge connects a bit (e.g., variable) node i with parity check node j.

Given a variable node $v_i$ (or bit node $b_i$), one may define the set of edges emitting from the node $v_i$ (or bit node $b_i$) by $E_v(i)=\{e|v(e)=i\}$ (or by $E_b(i)=\{e|b(e)=i\}$); these edges are referred to as bit edges, and the messages corresponding to these bit edges are referred to as bit edge messages.

Given a check node one may define the set of edges emitting from the node $c_j$ by $E_c(j)=\{e|c(e)=j\}$; these edges are referred to as check edges, and the messages corresponding to these check edges are referred to as check edge messages. Continuing on, the derivative result will be $|E_v(i)|=d_v$ (or $|E_b(i)|=d_b$) and $|E_c(j)|=d_c$.

Generally speaking, any codes that can be represented by a bipartite graph may be characterized as a graph code. It is also noted that an irregular LDPC code may also described using a bipartite graph. However, the degree of each set of nodes within an irregular LDPC code may be chosen according to some distribution. Therefore, for two different variable nodes, $v_{i_1}$ and $v_{i_2}$, of an irregular LDPC code, $|E_v(i_1)|$ may not equal to $|E_v(i_2)|$. This relationship may also hold true for two check nodes. The concept of irregular LDPC codes was originally introduced within M. Luby et al. in [3] referenced above.

In general, with a graph of an LDPC code, the parameters of an LDPC code can be defined by a degree of distribution, as described within M. Luby et al. in [3] referenced above and also within the following reference [4]:

[4] T. J. Richardson and R. L. Urbanke, "The capacity of low-density parity-check code under message-passing decoding," *IEEE Trans. Inform. Theory*, Vol. 47, No. 2, February 2001, pp. 599-618.

This distribution may be described as follows:

Let $\lambda_i$ represent the fraction of edges emanating from variable nodes of degree i and let $\rho_i$ represent the fraction of edges emanating from check nodes of degree i. Then, a degree distribution pair $(\lambda, \rho)$ is defined as follows:

$$\lambda(x) = \sum_{i=2}^{M_v} \lambda_i x^{i-1} \text{ and } \rho(x) = \sum_{i=2}^{M_c} \rho_i x^{i-1},$$

where $M_v$ and $M_c$ represent the maximal degrees for variable nodes and check nodes, respectively.

While many of the illustrative embodiments described herein utilize regular LDPC code examples, it is noted that certain aspects and/or embodiments of the invention are also operable to accommodate both regular LDPC codes and irregular LDPC codes.

It is also noted that many of the embodiments described herein employ the terminology of "bit node" and "bit edge message", or equivalents thereof. Oftentimes, in the art of LDPC decoding, the "bit node" and "bit edge message" are alternatively referred to as "variable node" and "variable edge message", in that, the bit values (or variable values) are those which are attempted to be estimated. Either terminology can be employed in accordance with certain aspects of the invention.

In accordance with LDPC coding, quasi-cyclic LDPC codes (as described in reference [5]) have become increasingly popular in recent times.

[5] Marc P. C. Fossorier, "Quasi-Cyclic Low-Density Parity-Check Codes From Circulant Permutation Matrices," IEEE Trans. Inform. Theory, Vol. 50, No. 8, August 2004, pp. 1788-1793.

A general description of such a quasi-cyclic LDPC code is that each codeword thereof, after undergoing a cyclic shift, will result in another codeword of the LDPC in most cases; since this is not true necessarily for all codewords of the LDPC code, hence the use of the term "quasi".

Typically, the manner in which such quasi-cycle LDPC codes are constructed in the art is using a brute force approach in which a designer simply tries a large number of variations without any real design methodology. There is no efficient methodology in the prior art by which such quasi-cyclic LDPC codes may be constructed.

Herein, a methodology is presented by which a large number of quasi-cyclic LDPC codes can be constructed in a very efficient manner for comparison and selection of one or more of those LDPC codes to be used in any of a wide variety of communication systems types and communication device types. Any other application context (e.g., including information storage device, etc.) in which ECC may be employed can also use one or more of these LDPC codes.

In addition, the manner presented herein in which LDPC codes may be constructed allows for a designer to compare and employ various sub-matrix sizes of the corresponding LDPC matrices.

Figure 6:
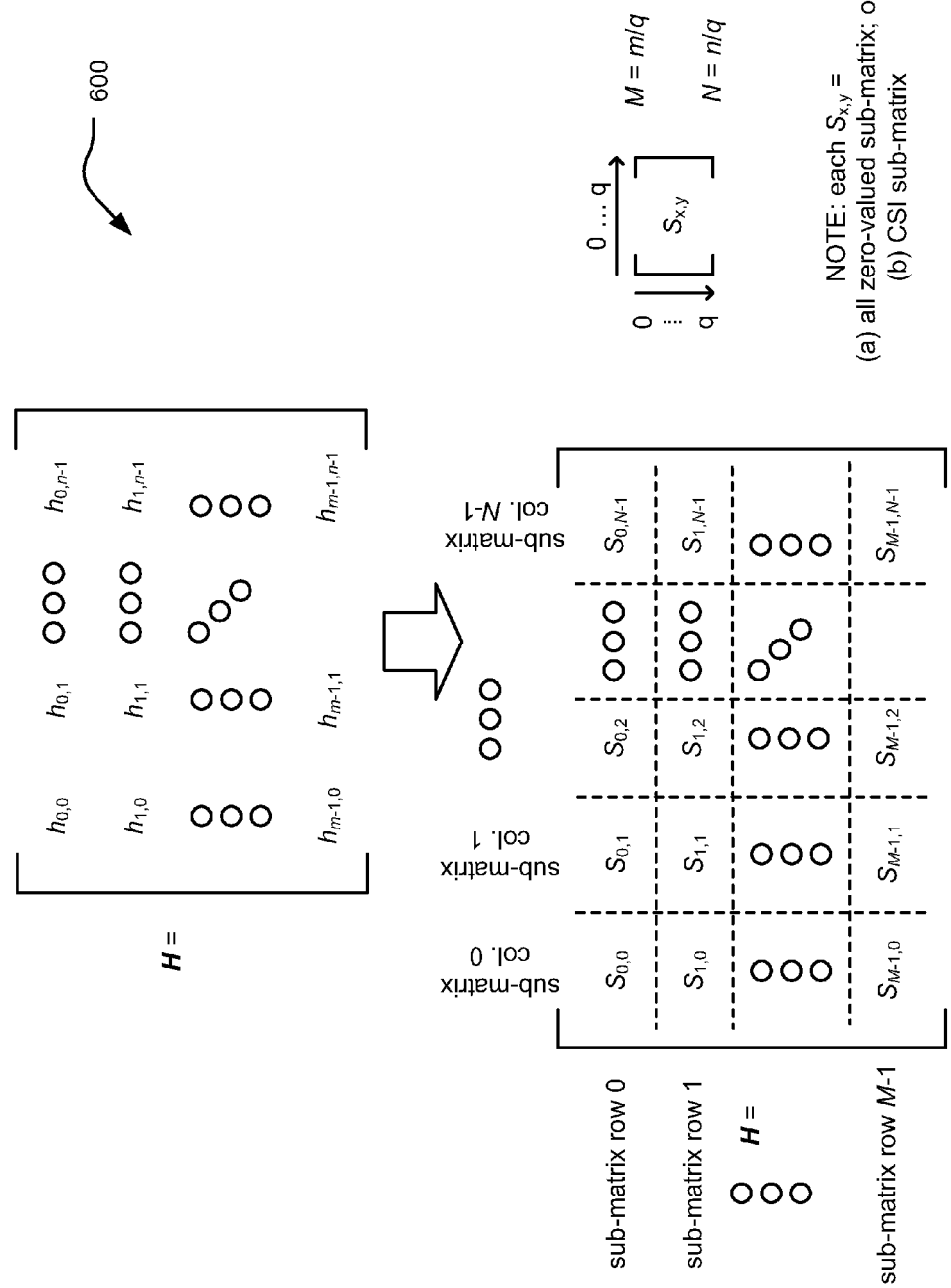
FIG. 6 illustrates an embodiment of the relationship between an overall LDPC matrix and the individual sub-matrices therein that include all zero-valued sub-matrices and/or CSI (Cyclic Shifted Identity) sub-matrices (including the sub-matrix rows and sub-matrix columns of the LDPC matrix).

FIG. 6 illustrates an embodiment 600 of the relationship between an overall LDPC matrix and the individual sub-matrices therein that include all zero-valued sub-matrices and/or CSI (Cyclic Shifted Identity) sub-matrices (including the sub-matrix rows and sub-matrix columns of the LDPC matrix).

A binary LDPC code may be fully described by its parity check matrix (i.e., its LDPC matrix). At the top of FIG. 6, the individual elements of an LDPC matrix, H, are shown:

$$H = \begin{bmatrix} h_{0,0} & h_{0,1} & \ldots & h_{0,n-1} \\ h_{1,0} & h_{1,1} & \ldots & h_{1,n-1} \\ \ldots & \ldots & \ldots & \ldots \\ h_{m-1,0} & h_{m-1,1} & \ldots & h_{m-1,n-1} \end{bmatrix}$$

where n is the number of bits in a codeword, m is the number of parity check equations of the LDPC code, and $h_{i,j}$ is either 0 or 1. An n-bit vector c (e.g., $c=(c_1, c_2, \ldots, c_N)$) is a codeword (i.e., of the LDPC code) if and only if $Hc^T=0$.

For such an LDPC code, the parity matrix H is also composed of a number of q-by-q (i.e., q×q) square sub-matrices as shown in the bottom portion of FIG. 6 and also below:

$$H = \begin{bmatrix} S_{0,0} & S_{0,1} & \ldots & S_{0,N-1} \\ S_{1,0} & S_{1,1} & \ldots & S_{1,N-1} \\ \ldots & \ldots & \ldots & \ldots \\ S_{M-1,0} & S_{M-1,1} & \ldots & S_{M-1,N-1} \end{bmatrix}$$

where M=m/q, N=n/q, and each sub-matrix, $S_{I,J}$, thereof is a q-by-q sub-matrix that is either an all zero-valued sub-matrix (i.e., in which all elements thereof are the value or zero "0") or a CSI (Cyclic Shifted Identity) sub-matrix. A CSI sub-matrix S is characterized by a shift-value, $\lambda(S)$, such that the components of S are defined as follows:

$$s_{i,j} = \begin{cases} 1 & \text{if } i + \lambda(S) = j(\text{mod} q) \\ 0 & \text{otherwise} \end{cases}$$

for any i and j, with $0 \le i < q$ and $0 \le j < q$. For example, the q-by-q identity matrix is itself a CSI matrix with a shift-value $\lambda(S)=0$ (i.e., a CSI sub-matrix that has undergone a cyclic shift of zero "0").

As can be seen, the LDPC matrix (as depicted in the lower portion of the diagram), includes various sub-matrix rows and sub-matrix columns. These sub-matrix rows and sub-matrix columns may be viewed as being based on the sub-matrix construction of the LDPC matrix (e.g., shown as sub-matrix rows 0 through M−1 and sub-matrix columns 0 through N−1).

Figure 7A:
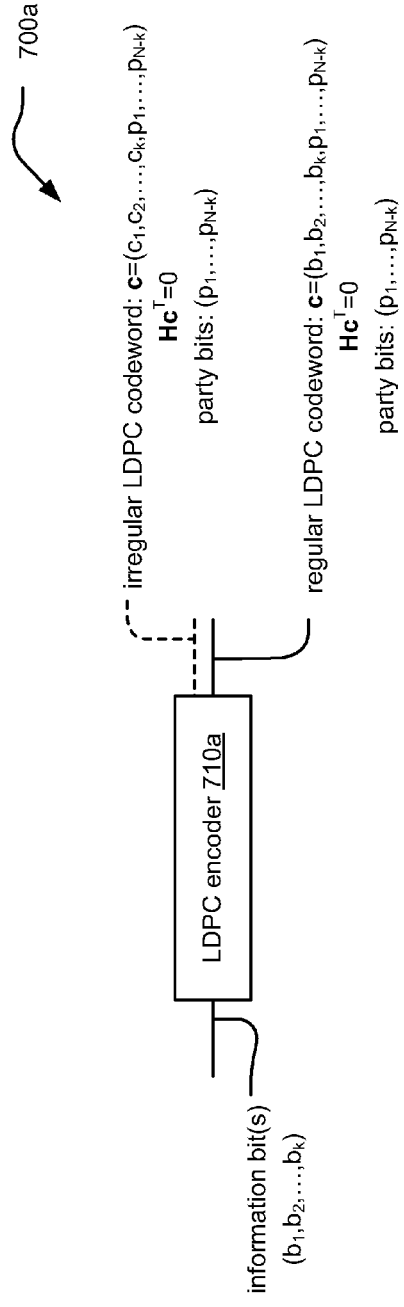
FIG. 7A illustrates an embodiment of encoding and the correspondence of an LDPC matrix.

FIG. 7A illustrates an embodiment 700a of encoding and the correspondence of an LDPC matrix. An LDPC encoder 710a receives a plurality of information bits (shown as ($b_1, b_2, \ldots, b_k$)) and generates an LDPC codeword there from. It is noted that once an LDPC matrix, H, is known, a corresponding generator matrix, G, can be determined as well. If the LDPC matrix itself is of a lower triangular form, then direct back substitution can be employed and the corresponding LDPC encoding is straight-forward.

In one embodiment, considering an LDPC code that is a systematic code, and of the LDPC codeword is shown as $c=(b_1, b_2, \ldots, b_k, p_1, p_2, \ldots, p_{N-k})$, then the LDPC codeword includes all of the information bits ($b_1, b_2, \ldots, b_k$) as well as parity bits ($p_1, p_2, \ldots, p_{N-k}$).

Clearly, irregular LDPC codes may also be employed herein without departing from the scope and spirit of the invention, and such a corresponding LDPC codeword would not necessarily and directly include all of the information bits ($b_1, b_2, \ldots, b_k$) therein, and may be generally shown as including coded bits ($c_1, c_2, \ldots, c_k$) as well as parity bits ($p_1, p_2, \ldots, p_{N-k}$).

Figure 7B:
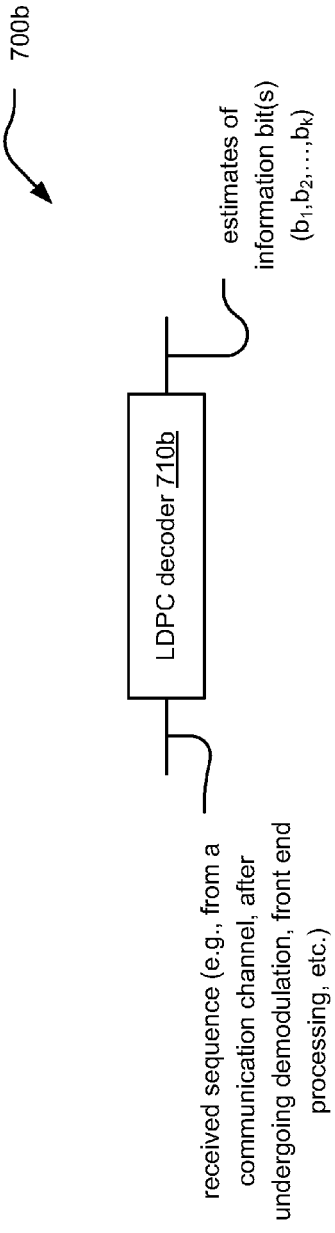
FIG. 7B illustrates an embodiment decoding and the correspondence of an LDPC matrix.

FIG. 7B illustrates an embodiment 700b decoding and the correspondence of an LDPC matrix. This embodiment 700b shows a received sequence (e.g., such as generated from a continuous time signal received from a communication channel after it has undergone any number of processing operations in accordance with demodulation and/or front end processing such as analog to digital conversion (ADC) or digital sampling, filtering (analog and/or digital), gain adjustment such as using a low noise amplifier (LNA), symbol mapping, etc.). Once an appropriate digital sequence is generated, then an LDPC decoder 710b can make estimates of those originally encoded information bits (e.g., shown as ($b_1, b_2, \ldots, b_k$) in the previous embodiment).

Figure 8:
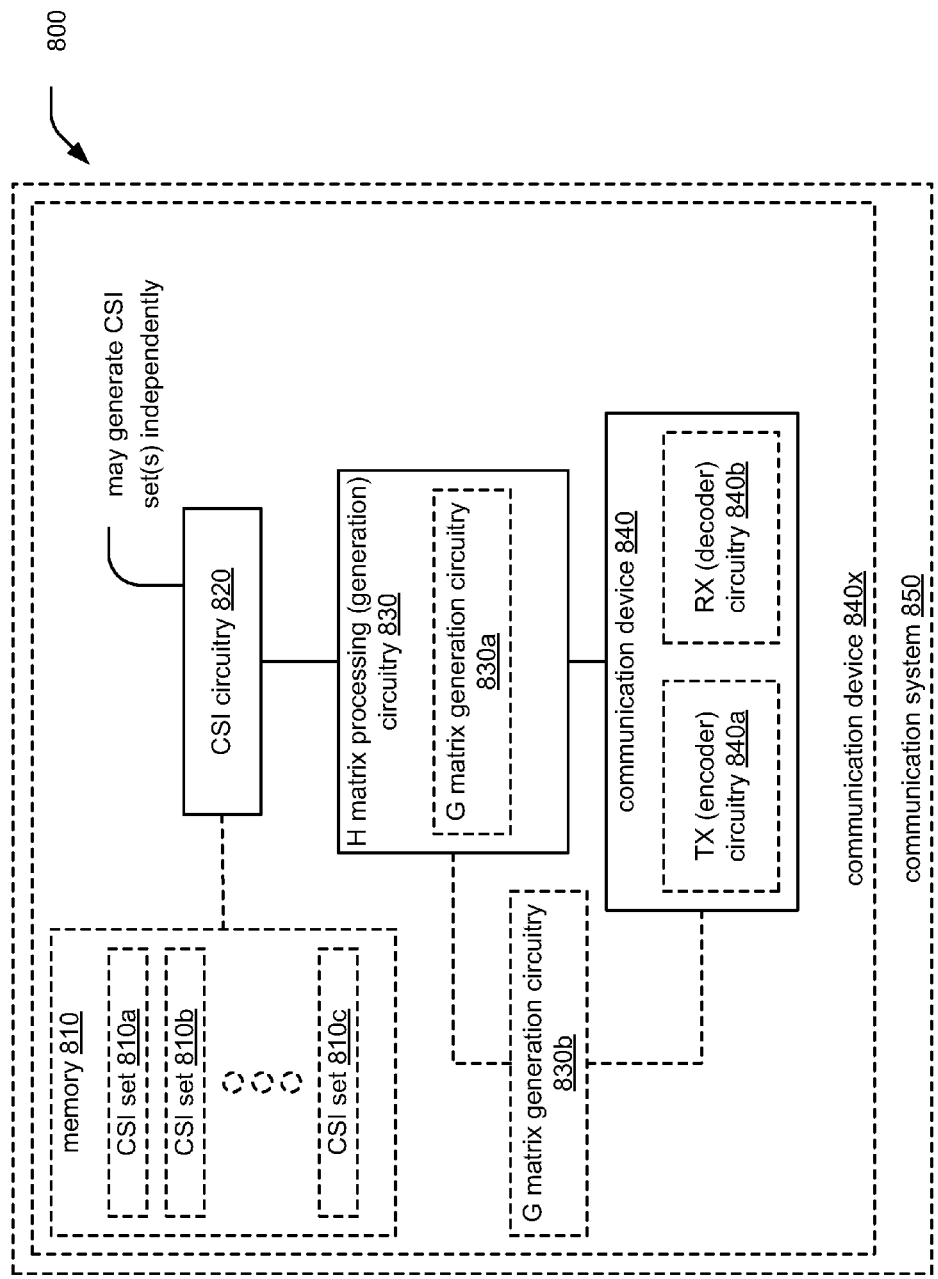
FIG. 8 illustrates an alternative embodiment of an apparatus that is operable to perform LDPC code construction and/or LDPC encoding and/or decoding processing.

FIG. 8 illustrates an alternative embodiment 800 of an apparatus that is operable to perform LDPC code construction and/or LDPC encoding and/or decoding processing. A CSI (Cyclic Shifted Identity) circuitry 820 operates to generate one or more sets of CSI values for cyclic shifting identity sub-matrices of one or more sub-matrix sizes. In some embodiments, the CSI circuitry 820 retrieves one or more sets of CSI values from a memory 810 that is coupled to the CSI circuitry 820. For example, the memory 820 can store one or more different CSI sets (shown as CSI set 810a, CSI set 810b, . . . and up to CSI set 810c). The CSI circuitry 820 can select one or more of the CSI sets 810a-810c as desired. Regardless of the manner by which the CSI circuitry 820 determines the one or more of the CSI sets, the CSI circuitry 820 then passes the one or more of the CSI sets to an LDPC matrix (H) processing (generation) circuitry 830, and the LDPC matrix (H) processing (generation) circuitry 830 then generates an LDPC matrix (H) corresponding to that particular LDPC code.

As mentioned above, it is noted that once an LDPC matrix (H) is known, a corresponding LDPC generator matrix (G) can be determined as well. An LDPC generator matrix (G) is that matrix by which information bits (e.g., an input bit group, tuple, stream, etc.) is multiplied to generate an LDPC codeword corresponding to that particular LDPC code. In some embodiments, an integrated LDPC generator matrix (G) circuitry 830a is included within the LDPC matrix (H) processing (generation) circuitry 830, so that such an LDPC generator matrix (G) can also be generated. In other embodiments, a separate LDPC generator matrix (G) circuitry 830b is coupled to the LDPC matrix (H) processing (generation) circuitry 830 that constructs the LDPC generator matrix (G).

A communication device 840 receives one or both of the constructed LDPC matrix (H) and the LDPC generator matrix (G). The communication device 840 may include a transmitter (TX) (encoder) circuitry 840a and a receiver (RX) (decoder) circuitry 840b.

The TX (encoder) circuitry 840a is operable to perform all necessary encoding in accordance with the LDPC generator matrix (G), as well as any appropriate transmitter related functions (e.g., digital to analog conversion, filtering (analog or digital), scaling (e.g., gain or attenuation), etc.) to generate a continuous time signal capable of being launched into a communication channel of interest.

The RX (decoder) circuitry 840b is operable to perform all necessary encoding in accordance with the LDPC matrix (H), as well as any appropriate receiver related functions (e.g., analog to digital conversion (sampling), filtering (analog or digital), scaling (e.g., gain or attenuation), equalization, etc.) to process a received continuous time and to make estimates of information bits encoded therein.

It is noted that all circuitries, modules, memory, etc. depicted in this diagram may alternatively be implemented in a communication device 840x. The communication device 840 or the communication device 840x may be implemented within a communication system 850 which may, in some embodiments, be any such communication system type as depicted and described with reference to FIG. 1.

Herein, a relatively low complexity LDPC decoding approach is presented that involves using a relatively limited number of layers (e.g., 4 layers) in accordance with layered LDPC decoding.

Several examples are employed using LDPC matrices having sub-matrix size of 42×42. The performance of many of the novel LDPC matrices constructed herein is compared with those used in IEEE 802.15.3c. The code rates of many of the exemplary and novel LDPC matrices constructed herein are 1/2, 5/8, and 3/4. However, it is noted that other code rates may alternatively be employed without departing from the scope and spirit of the invention. Various processing approaches of reusing an original (or first) LDPC matrix having a code rate of 1/2 are described to generate the corresponding (or second) LDPC matrices for code rates of 5/8 and 3/4.

In one embodiment, 50% of an original (or first) LDPC matrix is reused (e.g., for partial reuse) in every column thereby generating a second LDPC matrix that is used for LDPC coding (e.g., decoding and/or encoding). In an alternative embodiment, an entirety of an original (or first) LDPC matrix is reused (e.g., for full reuse) in every column thereby generating a second LDPC matrix that is used for LDPC coding (e.g., decoding and/or encoding)

Layered LDPC decoding (e.g., as in accordance with Belief Propagation (BP) layered LDPC decoding) operates using an LDPC matrix such that a given layer may include multiple rows of the original LDPC matrix. A degree of every column of the LDPC matrix may vary, and the decoding is performed such that bit information is updated in every layer and then passed to a successive layer. When decoding has been performed and estimates are propagated through all of the layers of the LDPC matrix, then a given decoding iteration (that includes all layers) is complete.

Herein, as a general rule, a low complexity LDPC decoding approach is achieved when each column of each layer has a degree that is less than or equal to one (1). The reader is referred to the written description portion associated with FIG. 5 regarding degrees of check nodes, degrees of bit nodes, etc. In order to achieve relatively lower complexity LDPC decoding, then the degree of any column of a particular layer of the LDPC matrix is kept to be less than or equal to one (1).

To achieve increased data throughput for advanced communication system applications (e.g., such as that in accordance with standards and/or recommended practices associated with the WGA (Wireless Gigabit Alliance), which was formerly known as NGmS (Next Generation millimeter wave Specification)), then the number of layers employed in accordance with layered LDPC decoding may generally by limited (e.g., 4 layers or less). For example, considering that WGA that plans to operate at 3010 Mbps (Mega-bits per second) for Quadrature Phase Shift Keying (QPSK) modulation, 6020 Mbps for 16 Quadrature Amplitude Modulation (QAM), and 9030 Mbps for 64 QAM, a relatively limited number of layers is chosen for LDPC decoding.

Figure 9:
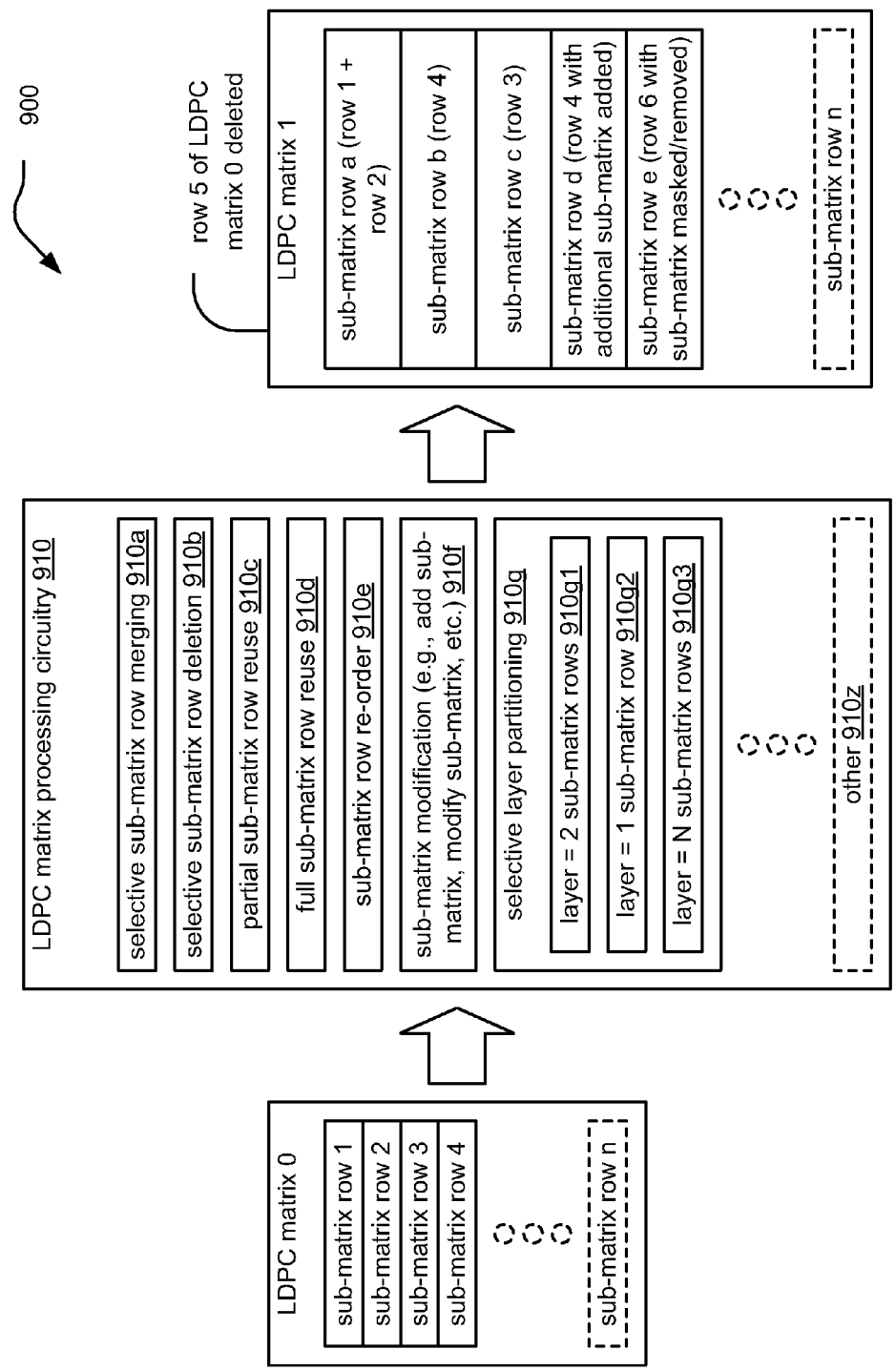
FIG. 9 illustrates an embodiment of an apparatus that is operable to perform LDPC matrix processing.

FIG. 9 illustrates an embodiment of an apparatus 900 that is operable to perform LDPC matrix processing. In this embodiment, and many of the other embodiments presented herein, reference is made to row of an LDPC matrix (when that LDPC matrix is described with respect to sub-matrix rows and columns), then a "row" thereof corresponds to a sub-matrix row, and a "column" thereof corresponds to a sub-matrix column.

A LDPC matrix processing circuitry 910 operates to perform appropriate modification of an LDPC matrix 0 (shown as having sub-matrix row 1, sub-matrix row 2, . . . , and up to sub-matrix row n) to generate an LDPC matrix 1. There are any number of processing operations that modify the LDPC matrix 0 thereby generating the LDPC matrix 1. For example, the LDPC matrix processing circuitrys 910 can perform selective sub-matrix row merging, as shown in a block 910a. This may involve adding two sub-matrix rows of the LDPC matrix 0 together to form a single sub-matrix row in the LDPC matrix 2. Also, the selective nature of this sub-matrix row merging allows for the merging of only a subset (e.g., as few as only 2) sub-matrix rows of the LDPC matrix 0. There is not a need to performing merging of each and every sub-matrix row of the LDPC matrix 0 to generate a merged sub-matrix row in the LDPC matrix 1.

In addition, the LDPC matrix processing circuitry 910 can perform selective sub-matrix row deletion of one or more sub-matrix rows in the LDPC matrix 0, as shown in a block 910b. The LDPC matrix processing circuitry 910 can perform partial sub-matrix row reuse (e.g., including only reusing certain sub-matrices therein), as shown in a block 910c. The LDPC matrix processing circuitry 910 can also perform full sub-matrix row reuse (e.g., using all sub-matrix rows when generating the LDPC matrix 1), as shown in a block 910d.

The LDPC matrix processing circuitry 910 can also perform sub-matrix row reordering (e.g., rearranging the order of sub-matrix rows), as shown in a block 910e. The LDPC matrix processing circuitry 910 can also perform sub-matrix modification, as shown in a block 910f. This can may involve adding a sub-matrix to a sub-matrix row (e.g., replacing an all zero-valued sub-matrix with a non-zero sub-matrix), modifying a sub-matrix.

The LDPC matrix processing circuitry 910 can also perform selective layer partitioning to identify layers that may be employed in accordance with layered LDPC decoding, as shown in a block 910g.

This may involve identifying 2 sub-matrix rows as a layer, as shown in a block 910g1. Alternatively, this may involve identifying a single sub-matrix row as a layer, as shown in a block 910g2. Generally speaking, this may involve identifying N sub-matrix rows as a layer (where N is an integer), as shown in a block 910g3. The LDPC matrix processing circuitry 910 can also perform any other processing operation, as shown generally in a block 910i.

Figure 10A:
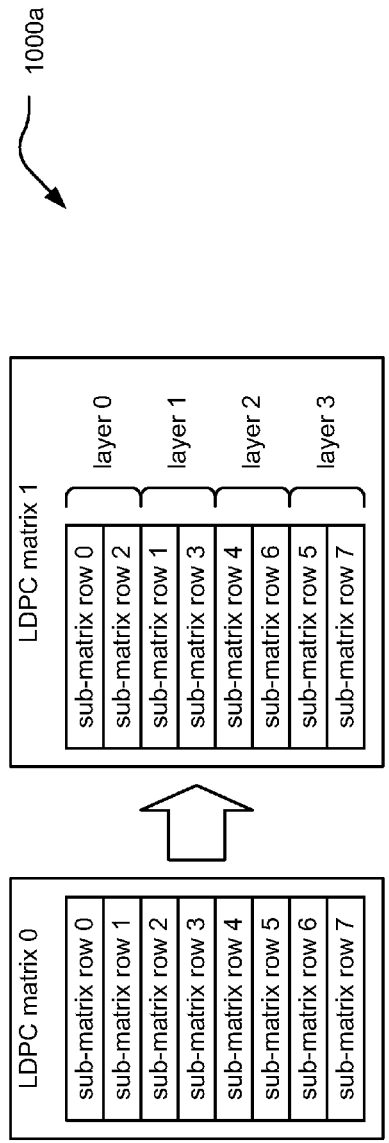
FIG. 10A and FIG. 10B illustrate embodiments of LDPC matrices undergoing processing.
Figure 10B:
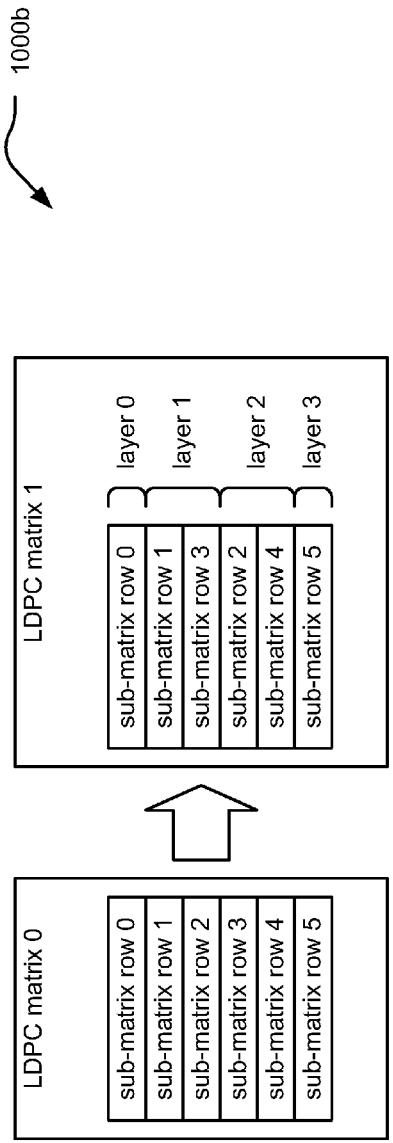

FIG. 10A and FIG. 10B illustrate embodiments 1000a and 1000b, respectively, of LDPC matrices undergoing processing. Again, in this embodiment, and many of the other embodiments presented herein, reference is made to row of an LDPC matrix (when that LDPC matrix is described with respect to sub-matrix rows and columns), then a "row" thereof corresponds to a sub-matrix row, and a "column" thereof corresponds to a sub-matrix column. In these diagrams, certain references to various rows therein correspond to sub-matrix rows therein.

Referring to embodiment 1000a of FIG. 10A, this shows how not only are sub-matrix rows of an LDPC matrix 0 re-ordered (e.g., rearranged), but that two of these re-ordered sub-matrix rows are then grouped to form respective layers of an LDPC matrix 1.

Referring to embodiment 1000b of FIG. 10B, this shows how not only are sub-matrix rows of an LDPC matrix 0 re-ordered (e.g., rearranged), but then in some instances two of these re-ordered sub-matrix rows are then grouped to form a respective layer of an LDPC matrix 1 and how in other instances only one of these re-ordered sub-matrix rows is included to form a respective layer of the LDPC matrix 1. In other words, some of the layers of the LDPC matrix 1 include 2 sub-matrix rows of the LDPC matrix 0, and other layers only include 1 sub-matrix row of the LDPC matrix 0.

Figure 11A:
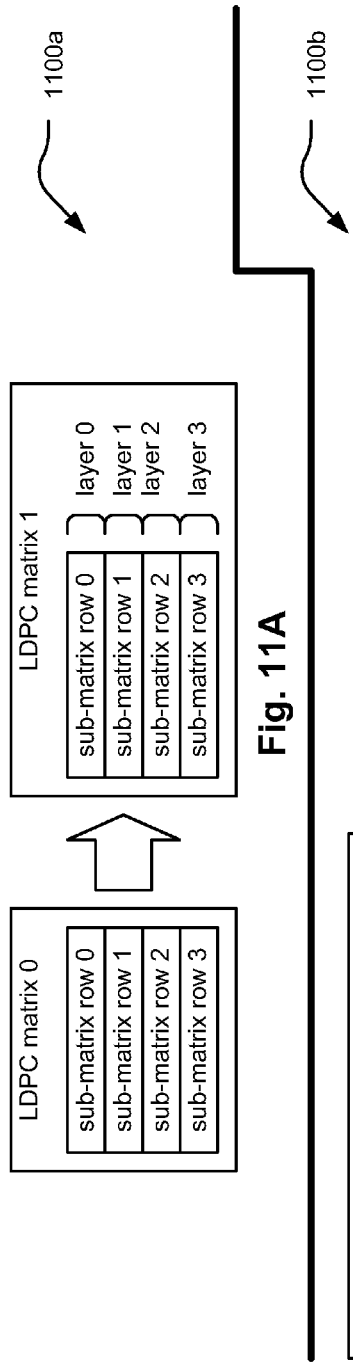
FIG. 11A and FIG. 11B illustrate alternative embodiments of LDPC matrices undergoing processing.
Figure 11B:
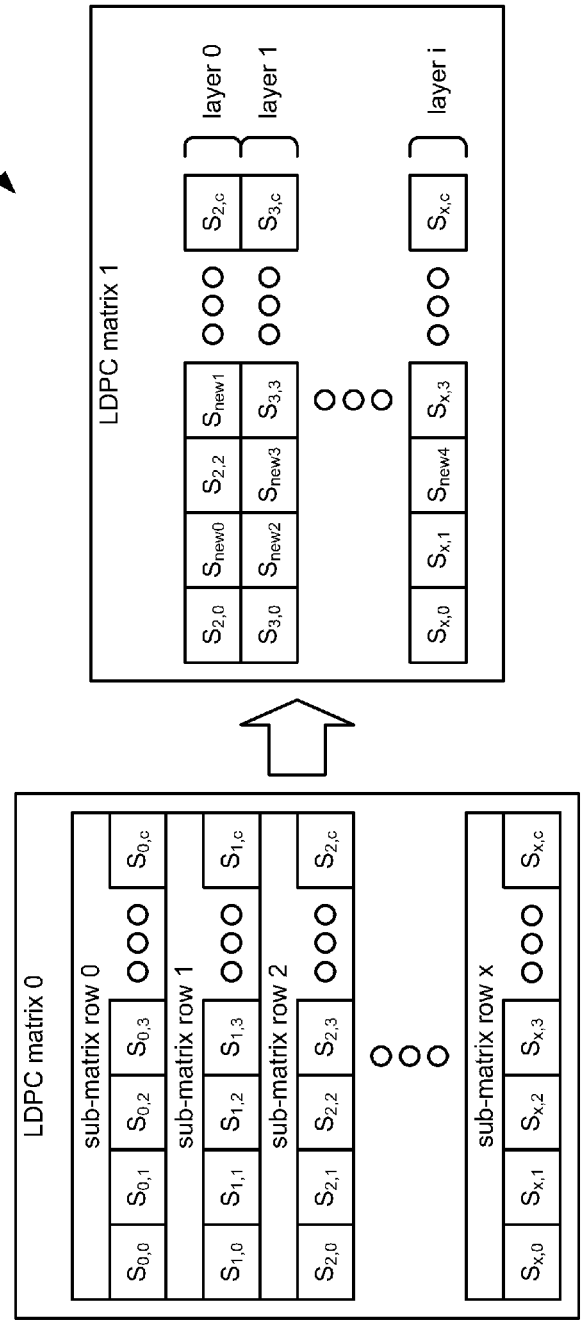

FIG. 11A and FIG. 11B illustrate alternative embodiments 1100a and 1100b, respectively, of LDPC matrices undergoing processing.

Referring to embodiment 1100a of FIG. 11A, this shows how the sub-matrix rows of an LDPC matrix 0 are not re-ordered (e.g., rearranged), and how each respective sub-matrix row then corresponds to one particular layer of an LDPC matrix 1.

Referring to embodiment 1100b of FIG. 11B, this shows how the individual sub-matrices of various sub-matrix rows within an LDPC matrix 0 can undergo manipulation and permutation when forming an LDPC matrix 1. In addition, it can be seen that new sub-matrices (e.g., shown as $S_{new0}$, $S_{new1}$, $S_{new2}$, etc.) may be placed within certain locations of the LDPC matrix 1. These new sub-matrices may be generated by modifying a particular sub-matrix within the LDPC matrix 0. Alternatively, entirely new sub-matrices may be used in these locations.

FIG. 12 illustrates an embodiment 1200 of processing an LDPC matrix, having code rate of 1/2 and sub-matrix size of 42×42, to generate a limited number of layers (e.g., 4) for subsequent decoding (e.g., using Belief Propagation (BP) decoding).

Considering the top LDPC matrix of this diagram, each sub-matrix therein is CSI sub-matrix S is characterized by a shift-value, $\lambda(S)$. For example, the top left hand sub-matrix has a value of 24, and is therefore a CSI sub-matrix with a shift-value of 24, $\lambda(24)$. All of the sub-matrices depicted as a "–" are all zero-valued sub-matrices. This notation may be employed to understand many of the remaining diagrams properly.

This shows how the top LDPC matrix (that includes 8 sub-matrix rows) is processed and combined to form 4 layers of the bottom LDPC matrix for use in layered LDPC decoding. As can also be seen, the order of the sub-matrix rows is also rearranged/re-ordered. This diagram corresponds to an LDPC code having a code rate of 1/2 and has sub-matrices of size 42×42 (e.g., $C_0(1/2, 42)$).

Oftentimes performance diagrams are described in the context of BLER (Block Error Rate) [or BER (Bit Error Rate)] versus $E_b/N_o$ (ratio of energy per bit $E_b$ to the Spectral Noise Density $N_o$) or SNR (Signal to Noise Ratio). This term $E_b/N_o$ is the measure of SNR for a digital communication system. When looking at such performance curves, the BLER [or BER] may be determined for any given $E_b/N_o$ (or SNR) thereby providing a relatively concise representation of the performance of the decoding approach.

Figure 13:
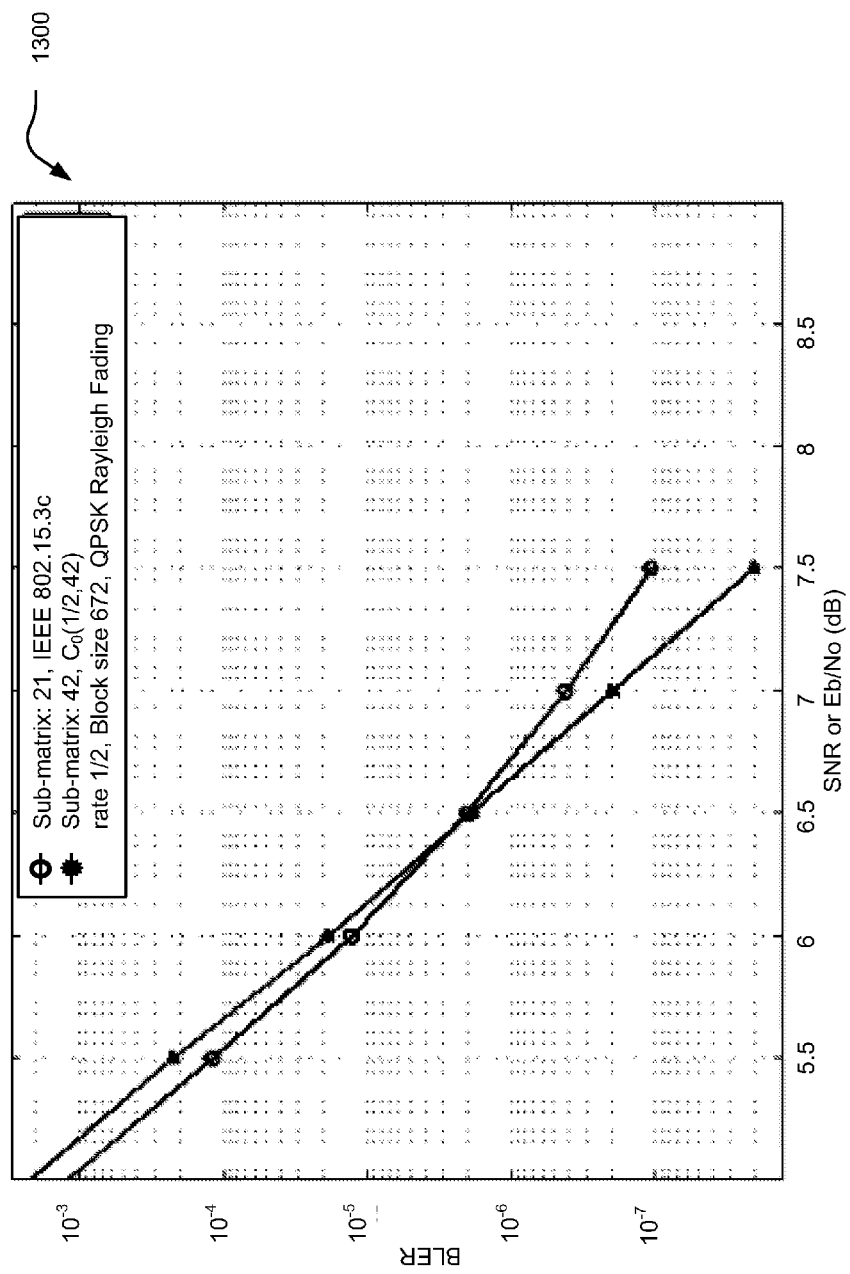
FIG. 13 illustrates an embodiment of performance comparisons of various rate 1/2 LDPC codes using QPSK on a Rayleigh fading communication channel.

FIG. 13 illustrates an embodiment 1300 of performance comparisons of various rate 1/2 LDPC codes using QPSK on a Rayleigh fading communication channel.

This diagram compares performance of the LDPC code corresponding to the bottom LDPC matrix of the previous diagram, that includes sub-matrices of size of 42×42, to performance of the LDPC code corresponding to IEEE 802.15.3c, that includes sub-matrices of size of 21×21.

Figure 14:
FIG. 14 illustrates an embodiment of processing an LDPC matrix, having code rate of 5/8 and sub-matrix size of 42×42, to generate a limited number of layers (e.g., 4) for subsequent decoding (e.g., using BP decoding).

FIG. 14 illustrates an embodiment 1400 of processing an LDPC matrix, having code rate of 5/8 and sub-matrix size of 42×42, to generate a limited number of layers (e.g., 4) for subsequent decoding (e.g., using BP decoding). This shows how the top LDPC matrix (that includes 6 sub-matrix rows) is processed and combined to form 4 layers of the bottom LDPC matrix for use in layered LDPC decoding. As can also be seen, the order of the sub-matrix rows is also rearranged/re-ordered. This diagram corresponds to an LDPC code having a code rate of 5/8 and has sub-matrices of size 42×42 (shown as $C_0(5/7, 42, 0\%)$).

Figure 15:
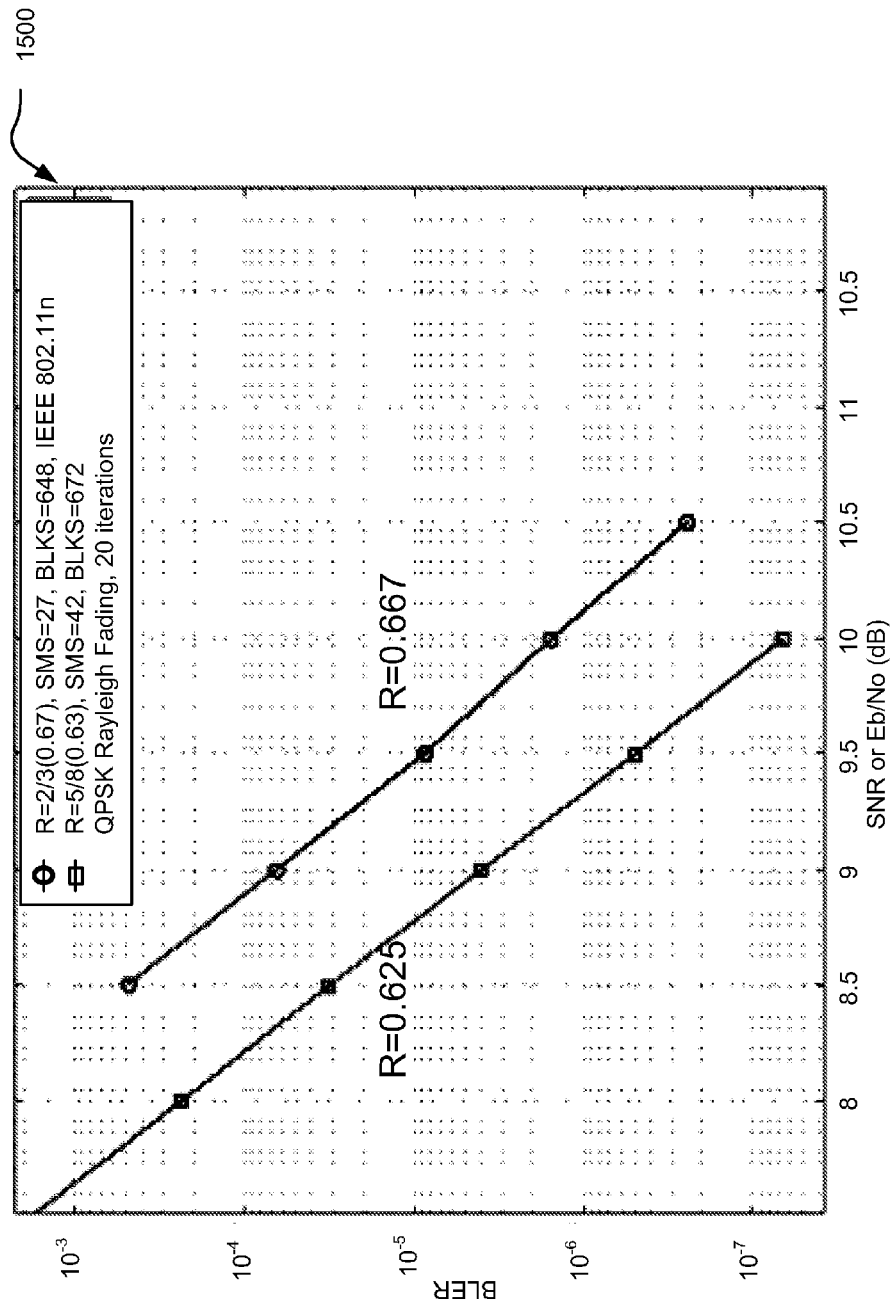
FIG. 15 illustrates an embodiment of performance comparisons of various rate 5/8 LDPC codes using QPSK on a Rayleigh fading communication channel.

FIG. 15 illustrates an embodiment 1500 of performance comparisons of various rate 5/8 LDPC codes using QPSK on a Rayleigh fading communication channel. This diagram compares performance of the LDPC code corresponding to the bottom LDPC matrix of the previous diagram, that includes sub-matrices of size of 42×42, to performance of the LDPC code corresponding to IEEE 802.11n, that includes sub-matrices of size of 27×27.

FIG. 16 illustrates an embodiment 1600 of processing an LDPC matrix, having code rate of 3/4 and sub-matrix size of 42×42, that undergoes sub-matrix row/layer partitioning to generate a limited number of layers (e.g., 4) for subsequent decoding (e.g., using BP decoding). This shows how the top LDPC matrix (that includes 4 sub-matrix rows) is not modified and each respective sub-matrix row is identified as one of the 4 layers of the bottom LDPC matrix for use in layered LDPC decoding. This diagram corresponds to an LDPC code having a code rate of 3/4 and has sub-matrices of size 42×42 (shown as $C_0$(3/4, 42, 0%)).

Figure 17:
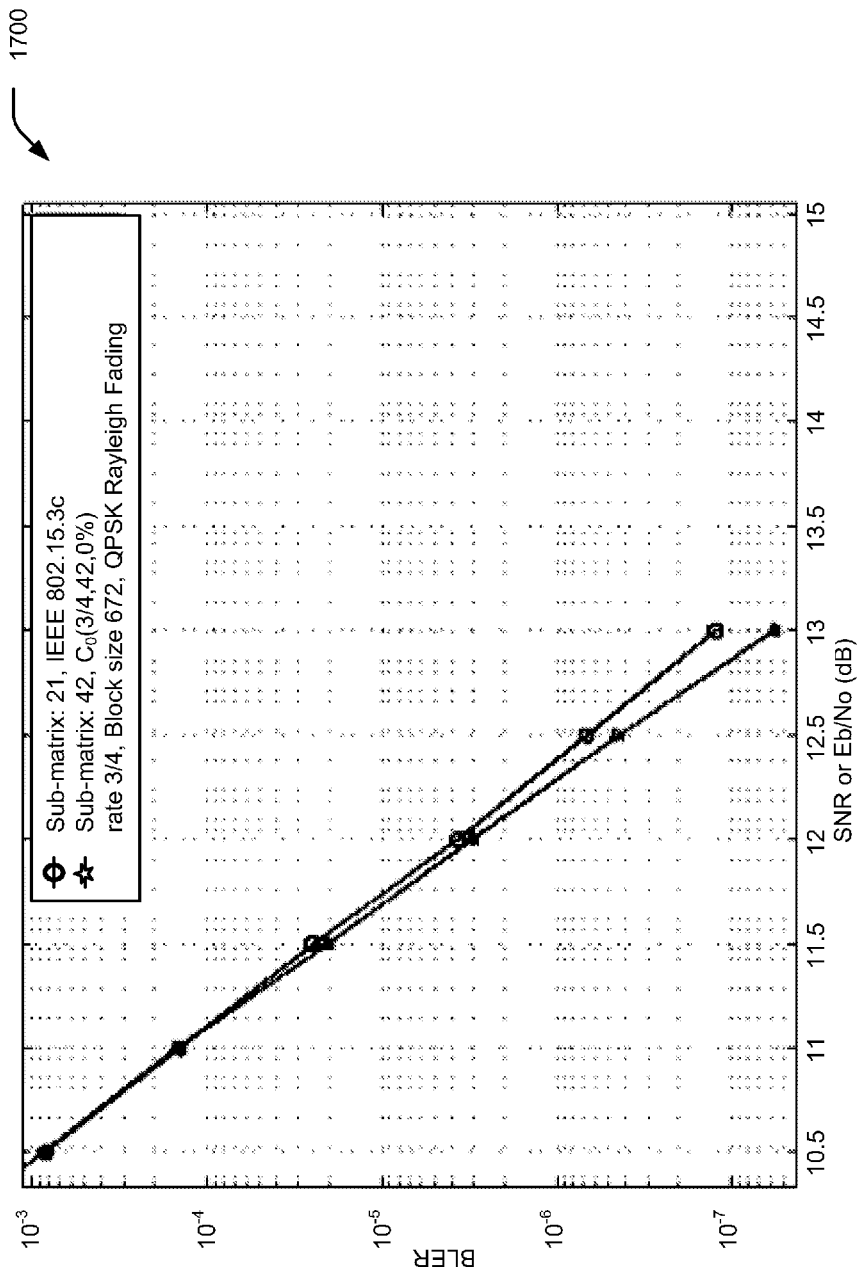
FIG. 17 illustrates an embodiment of performance comparisons of various rate 3/4 LDPC codes using QPSK on a Rayleigh fading communication channel.

FIG. 17 illustrates an embodiment 1700 of performance comparisons of various rate 3/4 LDPC codes using QPSK on a Rayleigh fading communication channel.

This diagram compares performance of the LDPC code corresponding to the bottom LDPC matrix of the previous diagram, that includes sub-matrices of size of 42×42, to performance of the LDPC code corresponding to IEEE 802.15.3c, that includes sub-matrices of size of 21×21.

Figure 18:
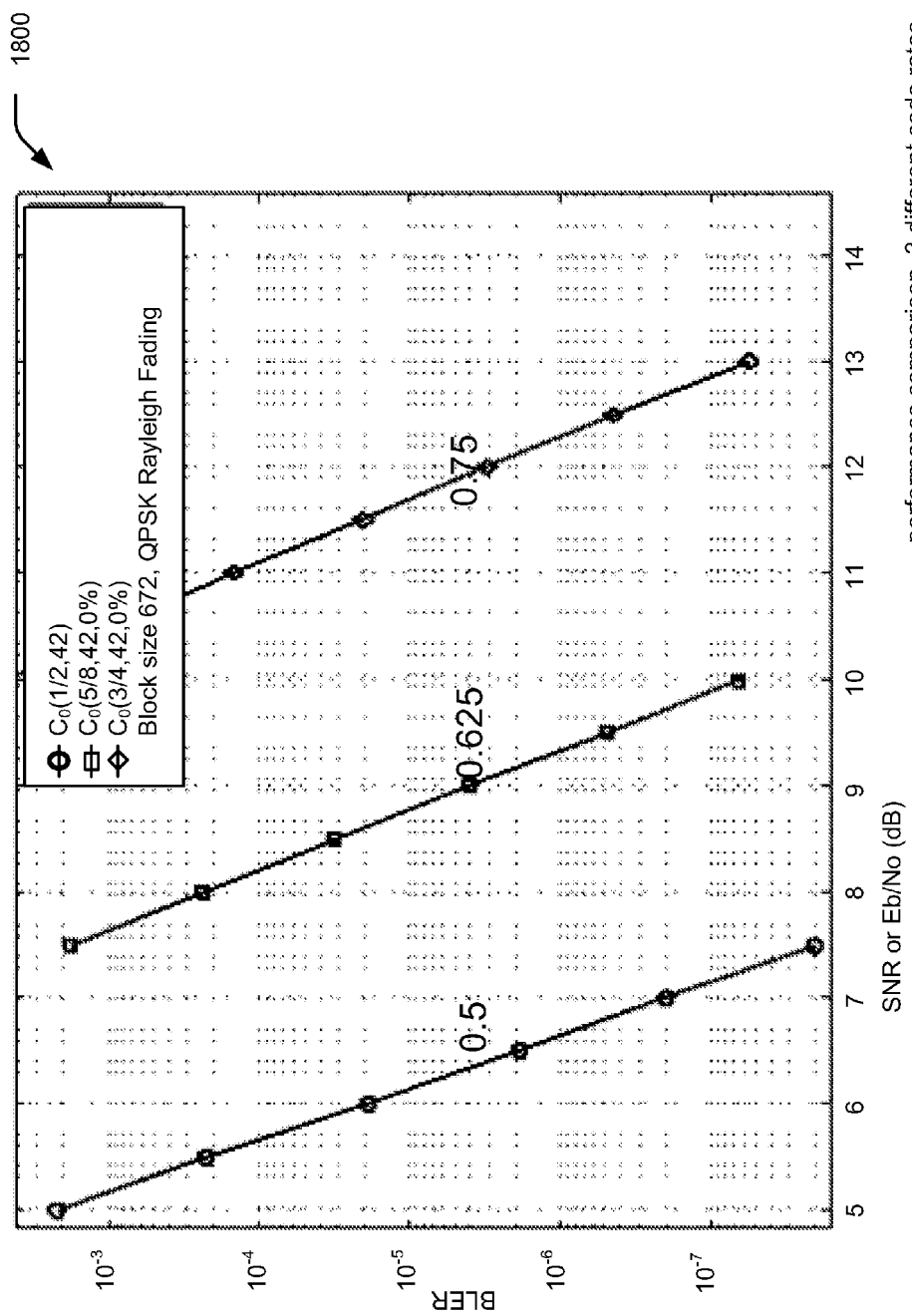
FIG. 18 illustrates an embodiment of performance comparisons of selected rate 1/2, 5/8, and 3/4 LDPC codes from previous FIG. 13, FIG. 15, and FIG. 17 using QPSK on a Rayleigh fading communication channel.

FIG. 18 illustrates an embodiment 1800 of performance comparisons of selected rate 1/2, 5/8, and 3/4 LDPC codes from previous FIG. 13, FIG. 15, and FIG. 17 using QPSK on a Rayleigh fading communication channel.

Figure 19:
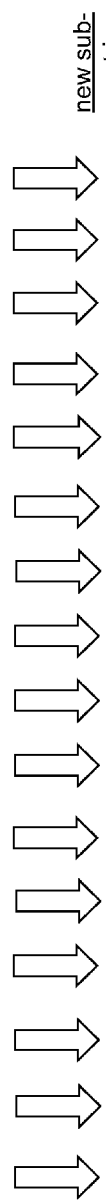
FIG. 19 illustrates an embodiment of LDPC matrix processing involving selective partial reuse of only selected sub-matrices of an original LDPC matrix.

FIG. 19 illustrates an embodiment 1900 of LDPC matrix processing involving selective partial reuse of only selected sub-matrices of an original LDPC matrix. This diagram corresponds to an LDPC code having a code rate of 1/2 and has sub-matrices of size 42×42 (shown as $C_0$(1/2, 42)). The bottom LDPC matrix is $C_0$(3/4, 42, 53%). As can also be seen, there are a number of sub-matrices that are new entries therein in the bottom LDPC matrix.

Figure 20:
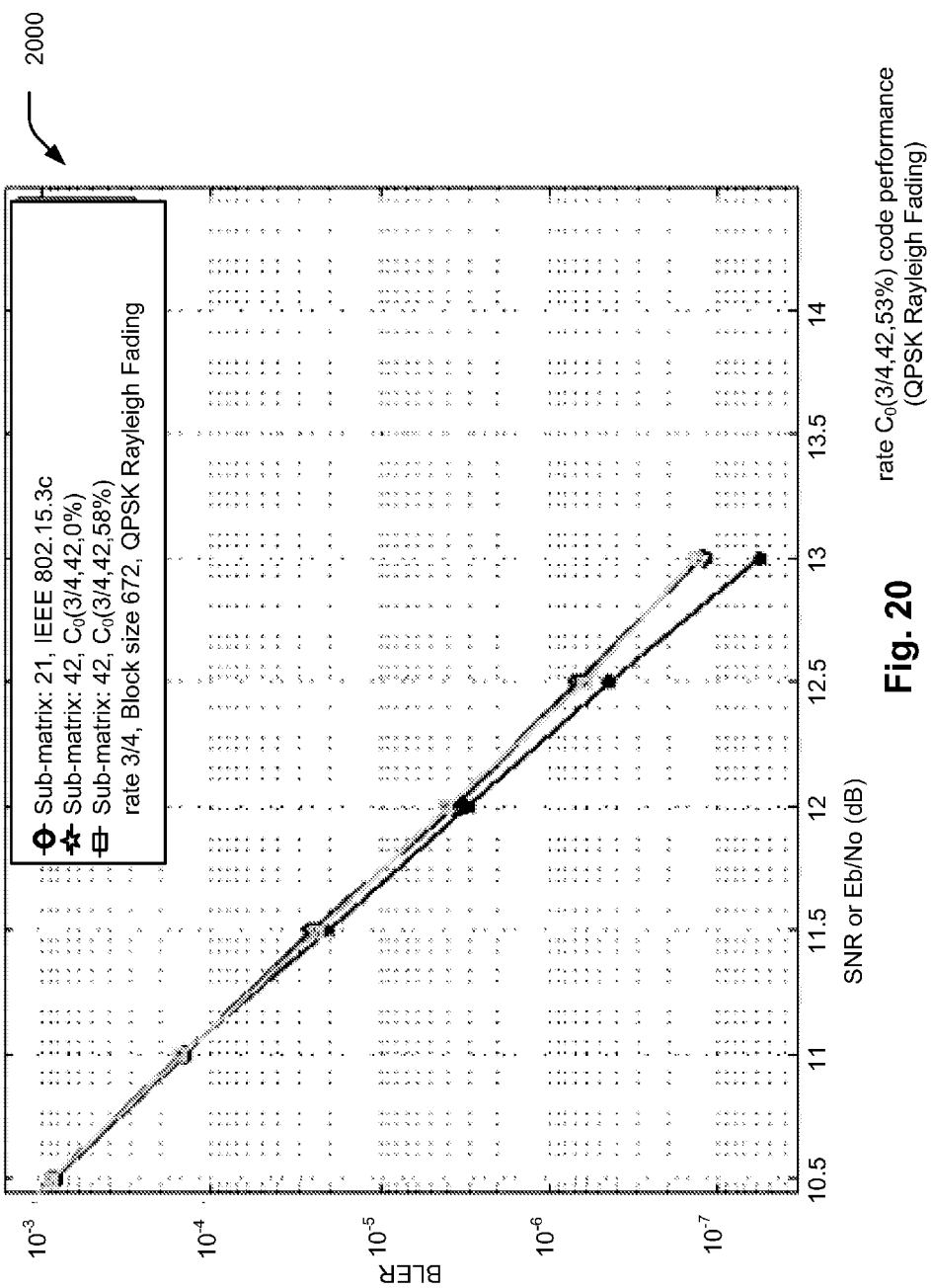
FIG. 20 illustrates an embodiment of performance comparisons of various rate 3/4 LDPC codes, having sub-matrix sizes of 21×21 or 42×42 and constructed using selective partial sub-matrix reuse, using QPSK on a Rayleigh fading communication channel.

FIG. 20 illustrates an embodiment 2000 of performance comparisons of various rate 3/4 LDPC codes, having sub-matrix sizes of 21×21 or 42×42 and constructed using selective partial sub-matrix reuse, using QPSK on a Rayleigh fading communication channel.

This diagram compares performance of the LDPC code corresponding to the top LDPC matrix and the bottom LDPC matrix of the previous diagram, that includes sub-matrices of size of 42×42, to performance of the LDPC code corresponding to IEEE 802.15.3c, that includes sub-matrices of size of 21×21.

FIG. 21 illustrates an embodiment 2100 of LDPC matrix processing involving full reuse of sub-matrices of an original LDPC matrix. All of the sub-matrix rows of the top LDPC matrix are employed when generating the bottom LDPC matrix. This diagram corresponds to an LDPC code having a code rate of 1/2 and has sub-matrices of size 42×42 (shown as $C_0$(1/2, 42)). The bottom LDPC matrix (shown as $C_1$(1/2, 42) includes 4 layers that can be employed in accordance with layered LDPC decoding.

Figure 22:
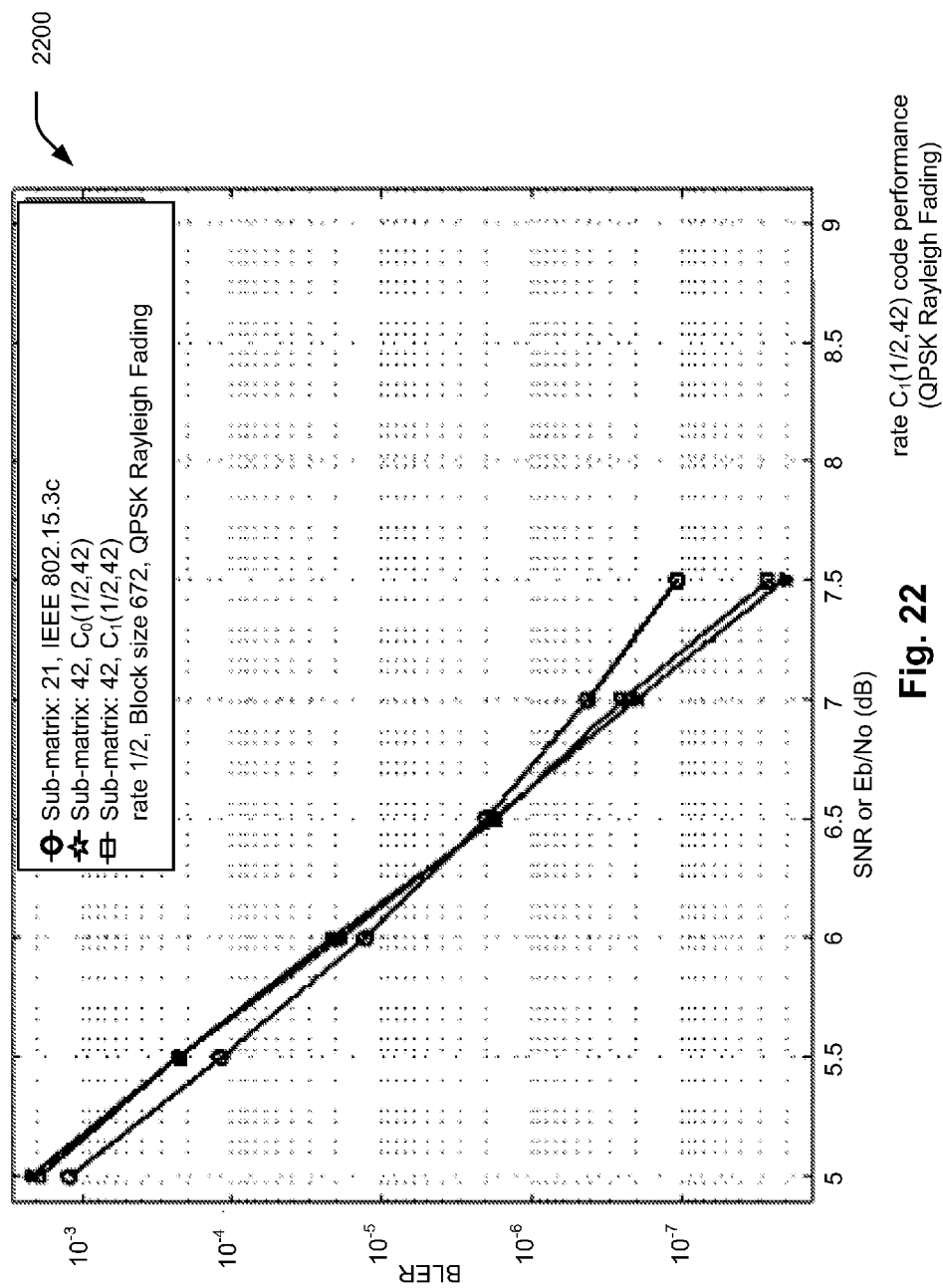
FIG. 22 illustrates an embodiment of performance comparisons of various rate 1/2 LDPC codes, having sub-matrix sizes of 21×21 or 42×42 and constructed using full sub-matrix reuse, using QPSK on a Rayleigh fading communication channel.

FIG. 22 illustrates an embodiment 2200 of performance comparisons of various rate 1/2 LDPC codes, having sub-matrix sizes of 21×21 or 42×42 and constructed using full sub-matrix reuse, using QPSK on a Rayleigh fading communication channel.

This diagram compares performance of the LDPC code corresponding to the top LDPC matrix $C_0$(1/2, 42) and the bottom LDPC matrix $C_1$(1/2, 42) of the previous diagram, that includes sub-matrices of size of 42×42, to performance of the LDPC code corresponding to IEEE 802.15.3c, that includes sub-matrices of size of 21×21.

FIG. 23 illustrates an embodiment 2300 of LDPC matrix processing involving selective sub-matrix row merging and selective addition/modification of sub-matrices of an original LDPC matrix. As can be seen, there are two added sub-matrices (having cyclic shift values of 5 and 0, respectively).

Figure 24:
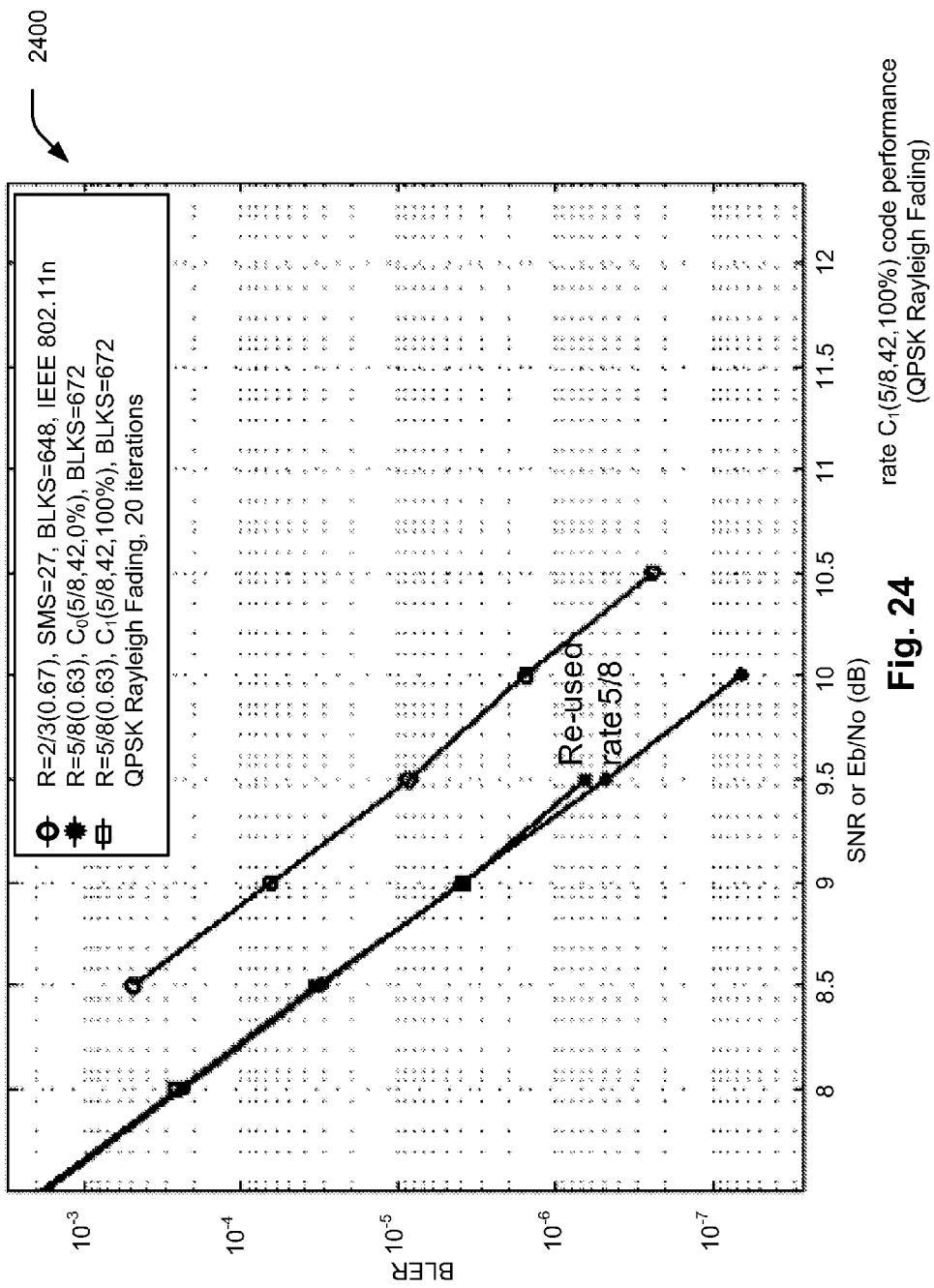
FIG. 24 illustrates an embodiment of performance comparisons of various rate 1/2 and 5/8 LDPC codes, having sub-matrix sizes of 27×27 or 42×42 and constructed using full sub-matrix reuse and selective sub-matrix addition/modification, using QPSK on a Rayleigh fading communication channel.

FIG. 24 illustrates an embodiment 2400 of performance comparisons of various rate 1/2 and 5/8 LDPC codes, having sub-matrix sizes of 27×27 or 42×42 and constructed using full sub-matrix reuse and selective sub-matrix addition/modification, using QPSK on a Rayleigh fading communication channel.

This diagram compares performance of the LDPC code corresponding to the top LDPC matrix $C_0$(5/6, 42, 0%) and the bottom LDPC matrix $C_1$(5/8, 42, 100%) of the previous diagram, that includes sub-matrices of size of 42×42, to performance of the LDPC code corresponding to IEEE 802.11n, that includes sub-matrices of size of 27×27.

Figure 25:
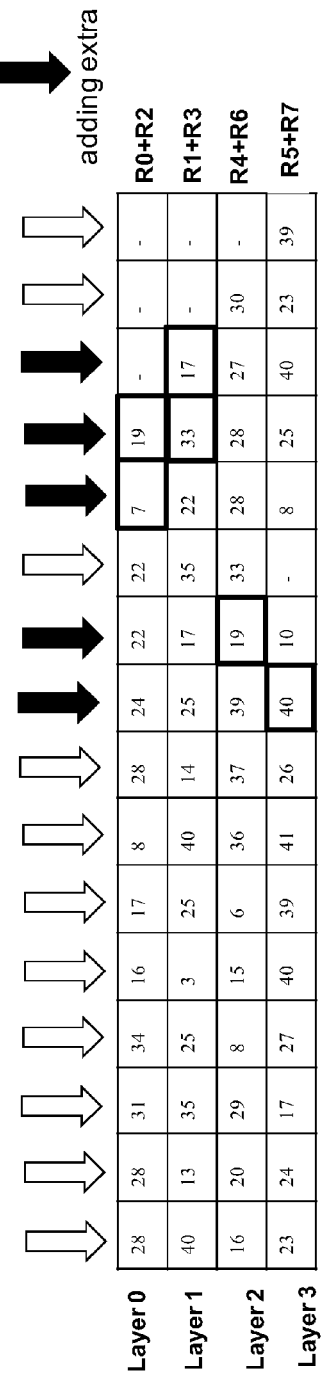
FIG. 25 illustrates an alternative embodiment of LDPC matrix processing involving selective sub-matrix row merging and selective addition/modification of sub-matrices of an original LDPC matrix.

FIG. 25 illustrates an alternative embodiment 2500 of LDPC matrix processing involving selective sub-matrix row merging and selective addition/modification of sub-matrices of an original LDPC matrix. This diagram corresponds to an LDPC code having a code rate of 1/2 and has sub-matrices of size 42×42 (shown as $C_o$(1/2, 42)). The bottom LDPC matrix (shown as $C_1$(3/4, 42, 100%) includes 4 layers that can be employed in accordance with layered LDPC decoding.

Figure 26:
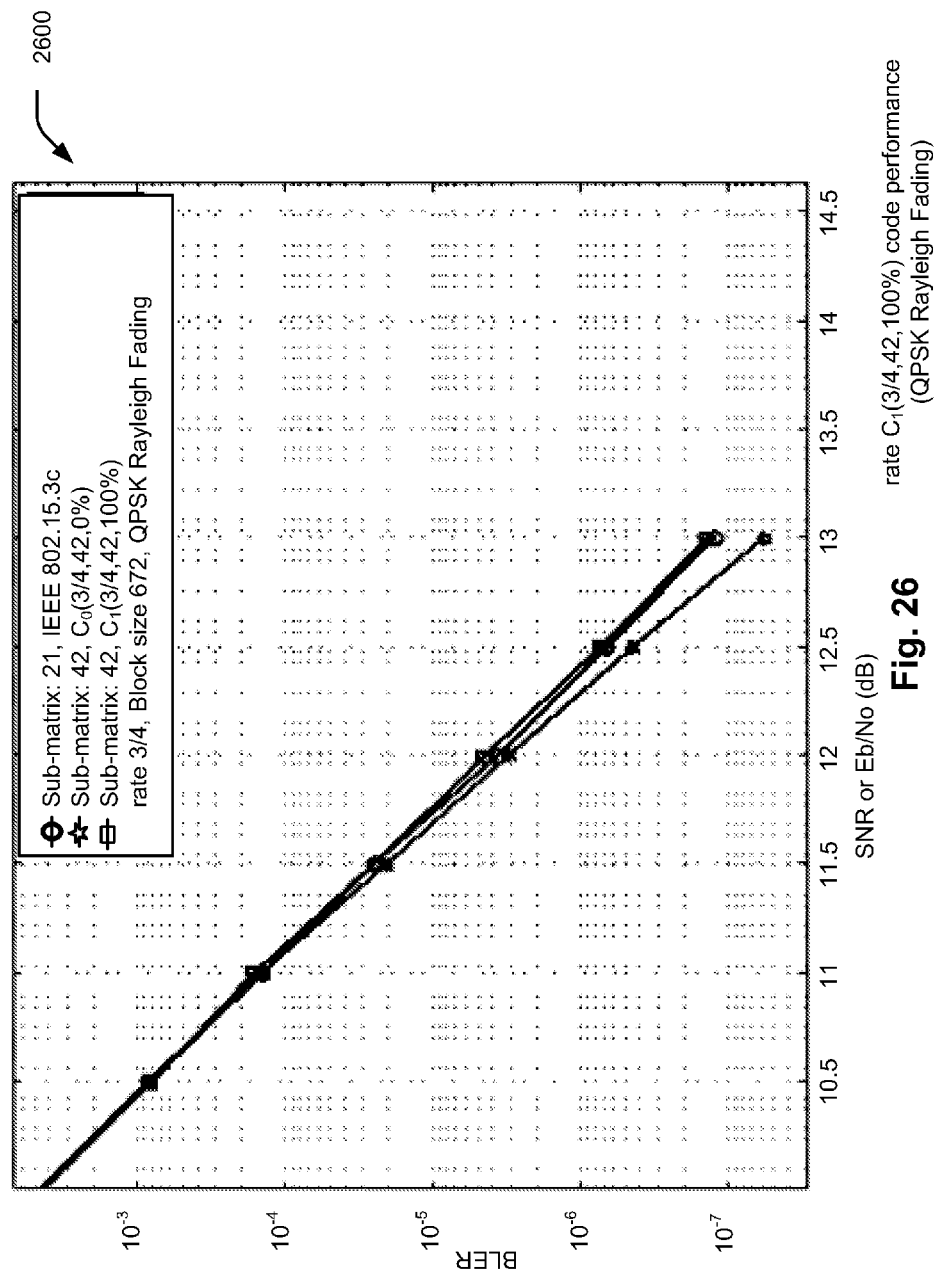
FIG. 26 illustrates an embodiment of performance comparisons of various rate 3/4 LDPC codes, having sub-matrix sizes of 21×21 or 42×42 and constructed using full sub-matrix reuse and selective sub-matrix addition/modification, using QPSK on a Rayleigh fading communication channel.

FIG. 26 illustrates an embodiment 2600 of performance comparisons of various rate 3/4 LDPC codes, having sub-matrix sizes of 21×21 or 42×42 and constructed using full sub-matrix reuse and selective sub-matrix addition/modification, using QPSK on a Rayleigh fading communication channel This diagram compares performance of the LDPC code corresponding to the top LDPC matrix $C_0$(3/4, 42, 0%) and the bottom LDPC matrix $C_1$(3/4, 42, 100%) of the previous diagram, that includes sub-matrices of size of 42×42, to performance of the LDPC code corresponding to IEEE 802.15.3c, that includes sub-matrices of size of 21×21.

Figure 27:
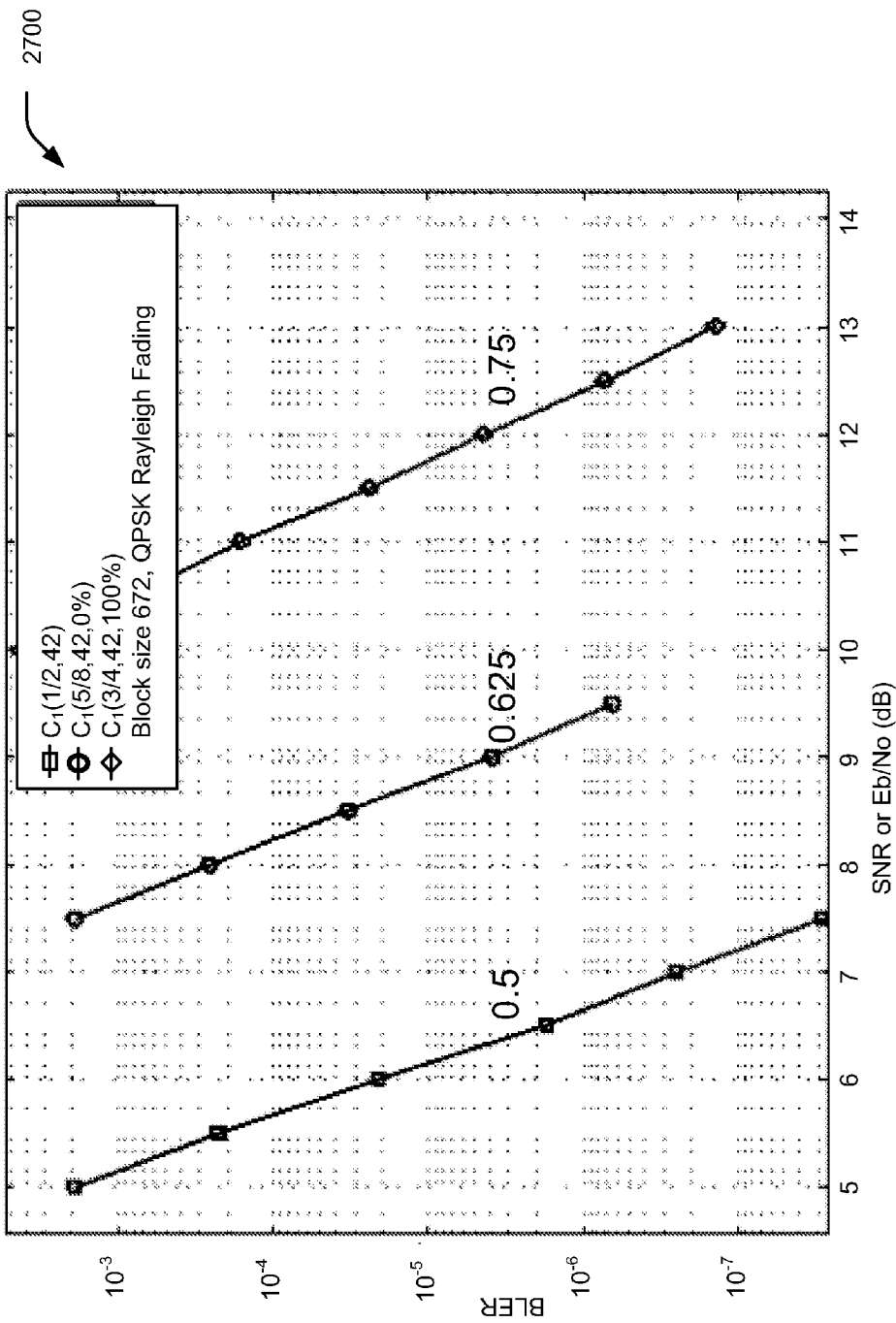
FIG. 27 illustrates an embodiment of performance comparisons of selected rate 1/2, 5/8, and 3/4 LDPC codes from previous FIG. 22, FIG. 24, and FIG. 26 using QPSK on a Rayleigh fading communication channel.

FIG. 27 illustrates an embodiment 2700 of performance comparisons of selected rate 1/2, 5/8, and 3/4 LDPC codes from previous FIG. 22, FIG. 24, and FIG. 26 using QPSK on a Rayleigh fading communication channel.

Figure 28:
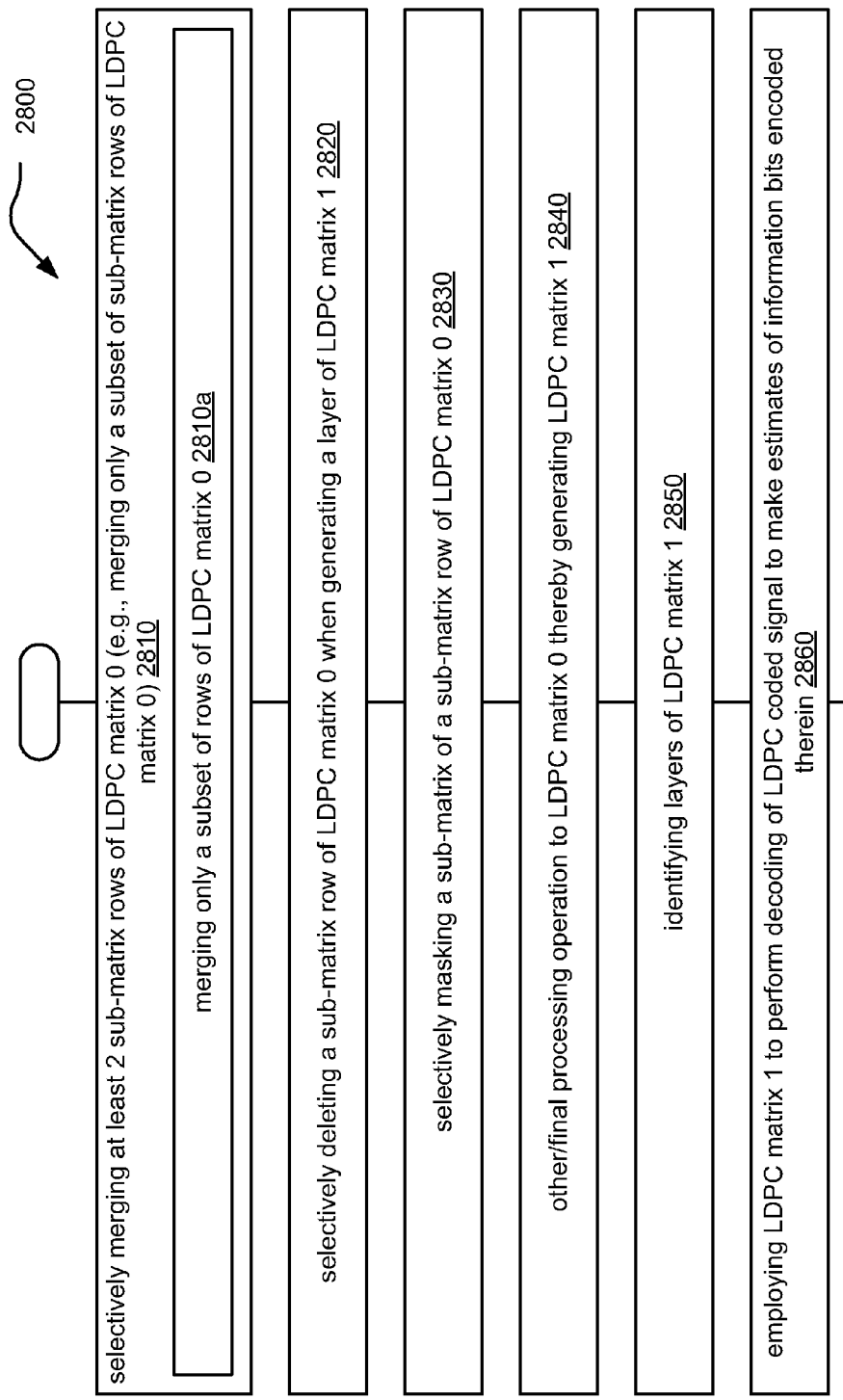
FIG. 28 illustrates an embodiment of a method for LDPC matrix processing.

FIG. 28 illustrates an embodiment of a method 2800 for LDPC matrix processing. The method 2800 begins by selectively merging at least 2 sub-matrix rows of LDPC matrix 0 (shown as merging only a subset of sub-matrix rows of LDPC matrix 0), as shown in a block 2810. This step of the method 2800 may involve merging only a subset of sub-matrix rows of LDPC matrix 0, as shown in a block 2810a.

The method 2800 continues by selectively deleting a sub-matrix row of LDPC matrix 0 when generating a layer of LDPC matrix 1, as shown in a block 2820. The method 2800 continues by selectively masking a sub-matrix of a sub-matrix row of LDPC matrix 0, as shown in a block 2830.

The method 2800 continues by other/final processing operation to LDPC matrix 0 thereby generating LDPC matrix 1, as shown in a block 2840. The method 2800 continues by identifying layers of LDPC matrix 1, as shown in a block 2850. The method 2800 continues by employing LDPC matrix 1 to perform decoding of LDPC coded signal to make estimates of information bits encoded therein, as shown in a block 2860.

FIG. 29 illustrates an alternative embodiment 2900 of LDPC matrix processing involving full sub-matrix reuse that involves sub-matrix row merging and reordering of sub-matrices of an original LDPC matrix.

In the top of this diagram, an LDPC code having a code rate of 3/4 and has sub-matrices of size 42×42 (shown as $C_1$(3/4, 42, 100%)) is shown. The bottom LDPC matrix (shown as $C_2$(13/16, 42, 100%)) includes 4 layers that can be employed in accordance with layered LDPC decoding.

As can be seen, the layers of the bottom LDPC matrix (shown as $C_2$(13/16, 42, 100%)) include 2 layers (i.e., layers 1, 2) that are the same (i.e., duplicates of one another). These layers each are formed by merging sub-matrix row 0 and sub-matrix row 2 of the top LDPC matrix (shown as $C_1$(3/4, 42, 100%)) thereby generating a sub-matrix row 2 of the bottom LDPC matrix (shown as $C_2$(13/16, 42, 100%)).

Figure 30:
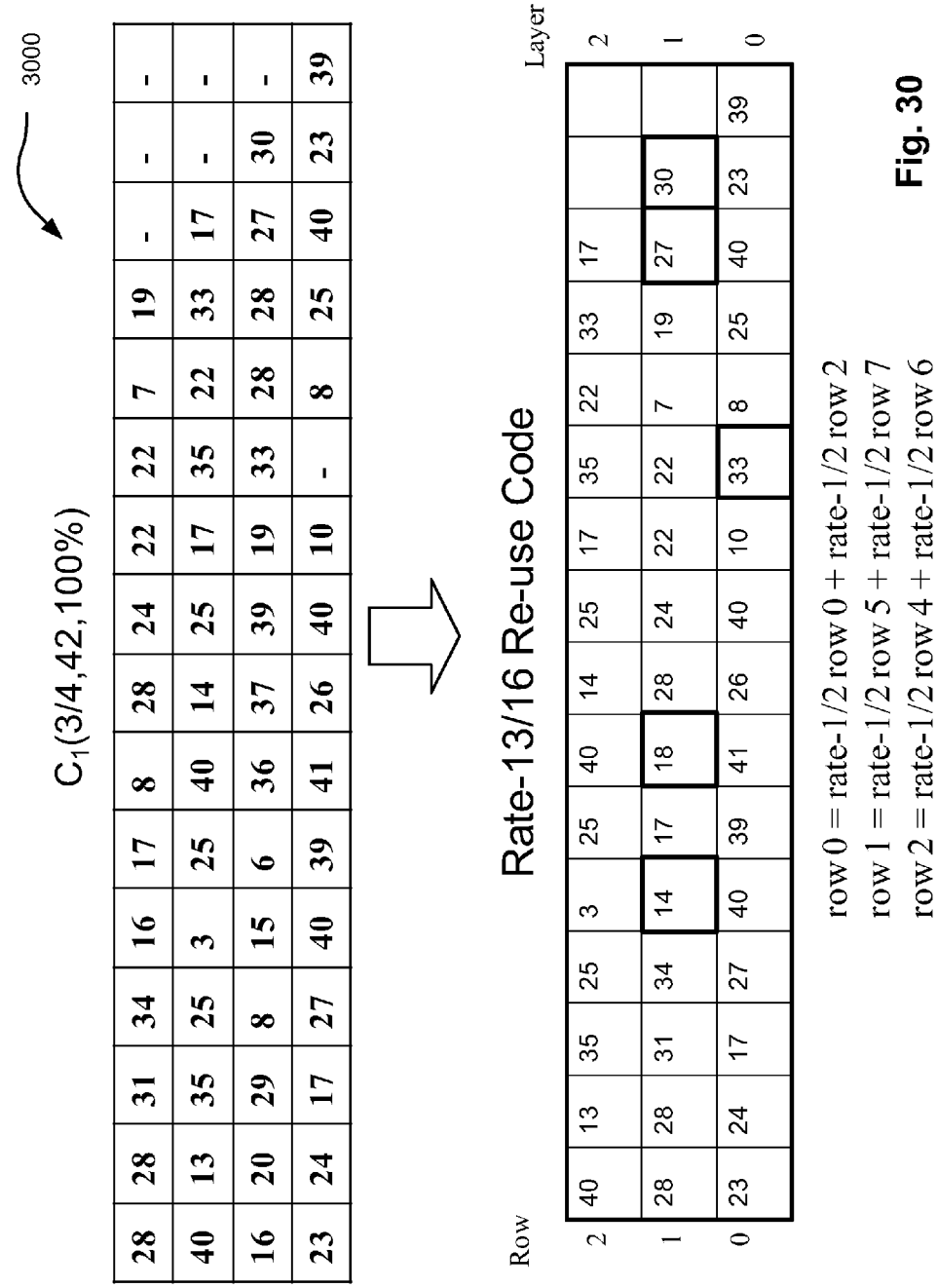
FIG. 30 illustrates another alternative embodiment of LDPC matrix processing involving full sub-matrix reuse that involves sub-matrix row merging and reordering of sub-matrices of an original LDPC matrix.

FIG. 30 illustrates another alternative embodiment 3000 of LDPC matrix processing involving full sub-matrix reuse that involves sub-matrix row merging and reordering of sub-matrices of an original LDPC matrix.

In the top of this diagram, an LDPC code having a code rate of 3/4 and has sub-matrices of size 42×42 (shown as $C_1$(3/4, 42, 100%)) is shown. The bottom LDPC matrix (shown as $C_3$(13/16, 42, 100%)) includes 3 layers (2, 1, 0) that can be employed in accordance with layered LDPC decoding.

As can be seen when comparing the top and bottom LDPC matrices of this embodiment, the top sub-matrix row (shown with sub-matrix having cyclic shift values of 28, 28, 31, etc.) of the top LDPC matrix, $C_1$(3/4, 42, 100%), is placed as the middle sub-matrix row of the bottom LDPC matrix, $C_3$(13/16, 42, 100%); four separate sub-matrices are modified therein by as shown by the modified sub-matrices having cyclic shift values of 14 vs. 16, 18 vs. 8, and the two sub-matrices having cyclic shift values of 27, 30 are taken from the third sub-matrix row of the top LDPC matrix, $C_1$(3/4, 42, 100%).

Also, as can be seen when comparing the top and bottom LDPC matrices of this embodiment, the second from the top sub-matrix row (shown with sub-matrix having cyclic shift values of 40, 13, 35, etc.) of the top LDPC matrix, $C_1$(3/4, 42, 100%), is placed as the top sub-matrix row of the bottom LDPC matrix, $C_3$(13/16, 42, 100%), without modification.

Also, as can be seen when comparing the top and bottom LDPC matrices of this embodiment, the bottom from the top sub-matrix row (shown with sub-matrix having cyclic shift values of 23, 24, 17, etc.) of the top LDPC matrix, $C_1$(3/4, 42, 100%), is placed as the bottom sub-matrix row of the bottom LDPC matrix, $C_3$(13/16, 42, 100%), with some modification; one sub-matrix of the bottom LDPC matrix, $C_3$(13/16, 42, 100%), is modified as shown by the modified sub-matrix having a cyclic shift value of 33 vs. "–" (i.e., which represents an all zero-valued sub-matrix).

Figure 31:
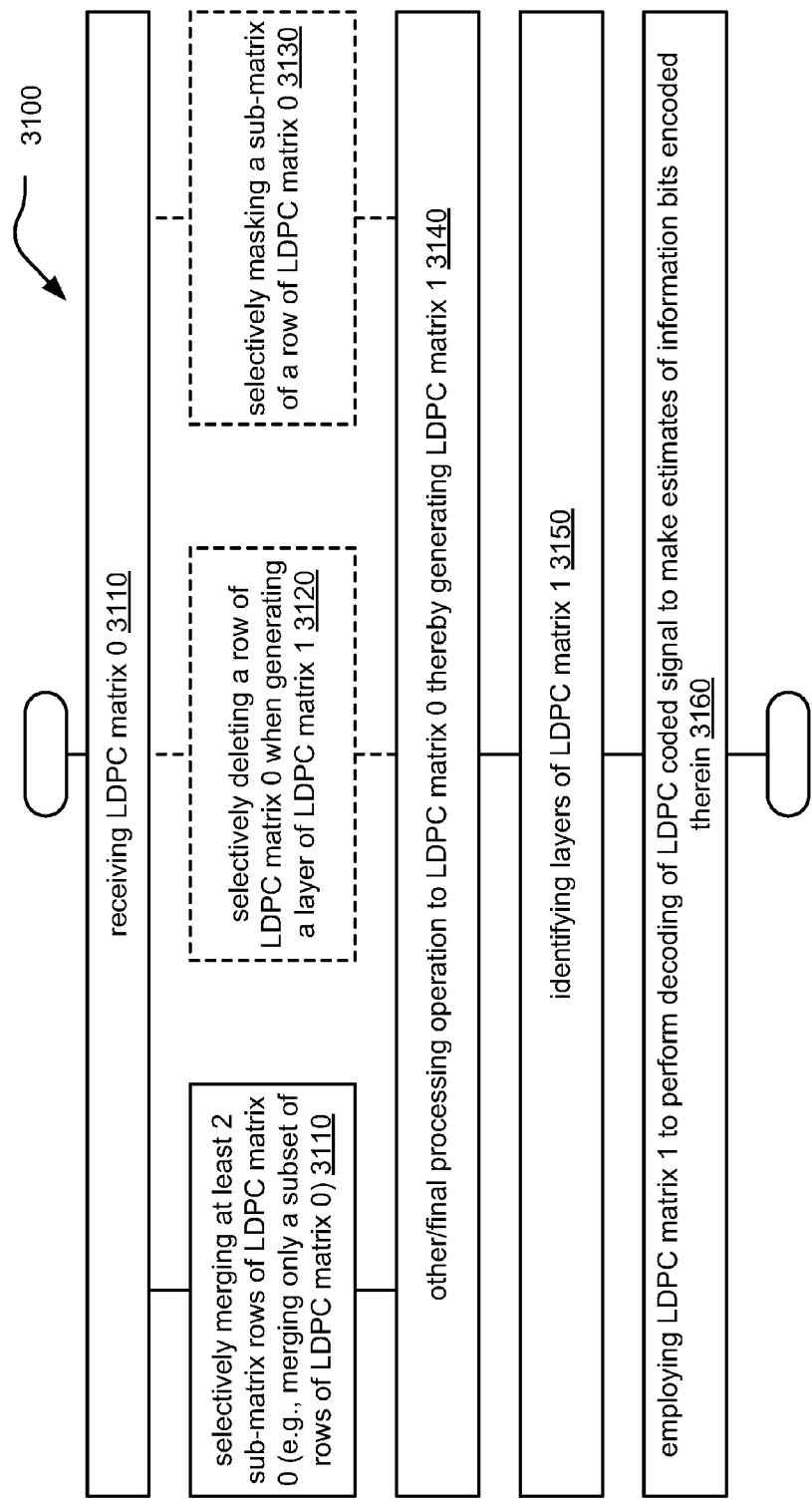
FIG. 31 illustrates an alternative embodiment of a method for LDPC matrix processing.

FIG. 31 illustrates an alternative embodiment of a method 3100 for LDPC matrix processing. The method 3100 begins by performing one or more of the operations depicted in the blocks 3110, 3120, and/or 3130. The operation of the block 3110 operates by selectively merging at least 2 sub-matrix rows of LDPC matrix 0 (shown as merging only a subset of sub-matrix rows of LDPC matrix 0). In some embodiments, this step of the method 3100 may involve merging only a subset of sub-matrix rows of LDPC matrix 0. The operation of the block 3120 continues by selectively deleting a sub-matrix row of LDPC matrix 0 when generating a layer of LDPC matrix 1. The operation of the block 3130 operates by selectively masking a sub-matrix of a sub-matrix row of LDPC matrix 0. This diagram shows that any combination of one or more operations of LDPC matrix processing may be performed on first LDPC matrix thereby generating a second LDPC matrix. This embodiment is analogous to the embodiment of FIG. 28, with at least one difference being that a subset of sub-matrix row, sub-matrix column, and/or sub-matrix (e.g., one or more sub-matrices located within one or more sub-matrix rows and/or columns) operations and modifications may be performed in any desired embodiment to generate a second LDPC matrix from a first LDPC matrix.

The method 3100 continues by other/final processing operation to LDPC matrix 0 thereby generating LDPC matrix 1, as shown in a block 3140. The method 3100 continues by identifying layers of LDPC matrix 1, as shown in a block 3150. The method 3100 continues by employing LDPC matrix 1 to perform decoding of LDPC coded signal to make estimates of information bits encoded therein, as shown in a block 3160.

It is noted that the various circuitries and/or modules (e.g., encoding modules, decoding modules, generation modules, or generally any module, etc.) described herein may be a single processing device or a plurality of processing devices. Such a processing device may be a microprocessor, microcontroller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The operational instructions may be stored in a memory. The memory may be a single memory device or a plurality of memory devices. Such a memory device may be a read-only memory, random access memory, volatile memory, non-volatile memory, static memory, dynamic memory, flash memory, and/or any device that stores digital information. It is also noted that when the processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. In such an embodiment, a memory stores, and a processing module coupled thereto executes, operational instructions corresponding to at least some of the steps and/or functions illustrated and/or described herein.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

What is claimed is:

1. An apparatus comprising:
a processor configured to modify a first low density parity check (LDPC) matrix to generate a second LDPC matrix by selectively merging at least a portion of two sub-matrix rows of the first LDPC matrix into a singular sub-matrix row of the second LDPC matrix; and
a decoder configured to perform layered Belief Propagation (BP) decoding on a plurality of layers of the second LDPC matrix to decode an LDPC signal to generate an estimate of an information bit encoded therein.

2. The apparatus of claim 1 further comprising:
the decoder configured to employ the second LDPC matrix to decode the LDPC signal to generate the estimate of the information bit encoded therein; and
the decoder configured to employ the first LDPC matrix to decode at least one additional LDPC signal to generate at least one additional estimate of at least one additional information bit encoded therein.

3. The apparatus of claim 1 further comprising:
the processor configured to process the first LDPC matrix or the second LDPC matrix to generate an LDPC generator matrix; and
an encoder to employ the LDPC generator matrix to encode at least one additional information bit to generate at least one additional LDPC coded signal.

4. The apparatus of claim 1 further comprising:
the processor configured to generate the second LDPC matrix via modification of the first LDPC matrix, the processor configured to perform at least one of:
selectively deleting a sub-matrix row of the first LDPC matrix; or
partial re-using of only selected sub-matrix rows, being fewer than all sub-matrix rows, of the first LDPC matrix.

5. The apparatus of claim 1 further comprising:
a communication device that is operative within at least one of a satellite communication system, a wireless communication system, a wired communication system, or a fiber-optic communication system.

6. An apparatus comprising:
a processor configured to modify a first low density parity check (LDPC) matrix to generate a second LDPC matrix; and
a decoder configured to:
employ the first LDPC matrix to decode a first LDPC signal to generate a first estimate of a first information bit encoded therein; and
employ the second LDPC matrix to decode a second LDPC signal to generate a second estimate of a second information bit encoded therein.

7. The apparatus of claim 6 further comprising:
the processor configured to process the first LDPC matrix or the second LDPC matrix to generate an LDPC generator matrix; and
an encoder configured to employ the LDPC generator matrix to encode at least one additional information bit to generate at least one additional LDPC coded signal.

8. The apparatus of claim 6 further comprising:
the processor configured to:
process the first LDPC matrix to generate a first LDPC generator matrix; and
process the second LDPC matrix to generate a second LDPC generator matrix; and
an encoder configured to:
employ the first LDPC generator matrix to encode a third information bit to generate a third LDPC coded signal; and
employ the second LDPC generator matrix to encode a fourth information bit to generate a fourth LDPC coded signal.

9. The apparatus of claim 6 further comprising:
the processor configured to generate the second LDPC matrix via modification of the first LDPC matrix, the processor configured to perform at least one of:
selectively merging at least two sub-matrix rows of the first LDPC matrix into a singular sub-matrix row of the second LDPC matrix;
selectively deleting a sub-matrix row of the first LDPC matrix; or
partial re-using of only selected sub-matrix rows, being fewer than all sub-matrix rows, of the first LDPC matrix.

10. The apparatus of claim 6 further comprising:
the processor configured to generate the second LDPC matrix via modification of the first LDPC matrix, the processor configured to perform partitioning of a plurality of sub-matrix rows of the first LDPC matrix into a plurality of layers of the second LDPC matrix; and
the decoder configured to perform layered Belief Propagation (BP) decoding on the plurality of layers of the second LDPC matrix to decode the second LDPC signal to generate the second estimate of the second information bit encoded therein.

11. The apparatus of claim 6 further comprising:
the processor configured to replace an all-zero valued sub-matrix within a sub-matrix row of the first LDPC matrix with a CSI (Cyclic Shifted Identity) sub-matrix to generate the second LDPC matrix.

12. The apparatus of claim 6 further comprising:
the processor configured to replace a CSI (Cyclic Shifted Identity) sub-matrix within a sub-matrix row of the first LDPC matrix with an all-zero valued sub-matrix to generate the second LDPC matrix.

13. The apparatus of claim 6 further comprising:
a communication device that is operative within at least one of a satellite communication system, a wireless communication system, a wired communication system, or a fiber-optic communication system.

14. A method execution by a communication device, the method comprising:
via an input of the communication device, receiving a first low density parity check (LDPC) signal and a second LDPC signal;
modifying a first LDPC matrix to generate a second LDPC matrix;
employing the first LDPC matrix to decode a first LDPC signal to generate a first estimate of a first information bit encoded therein; and
employing the second LDPC matrix to decode a second LDPC signal to generate a second estimate of a second information bit encoded therein.

15. The method of claim 14 further comprising:
processing the first LDPC matrix or the second LDPC matrix to generate an LDPC generator matrix; and
employing the LDPC generator matrix to encode at least one additional information bit to generate at least one additional LDPC coded signal.

16. The method of claim 14 further comprising:
processing the first LDPC matrix to generate a first LDPC generator matrix;
processing the second LDPC matrix to generate a second LDPC generator matrix;
employing the first LDPC generator matrix to encode a third information bit to generate a third LDPC coded signal; and employing the second LDPC generator matrix to encode a fourth information bit to generate a fourth LDPC coded signal.

17. The method of claim 14 further comprising:
to generate the second LDPC matrix via modification of the first LDPC matrix, performing at least one of:
selectively merging at least two sub-matrix rows of the first LDPC matrix into a singular sub-matrix row of the second LDPC matrix;
selectively deleting a sub-matrix row of the first LDPC matrix; or
partial re-using of only selected sub-matrix rows, being fewer than all sub-matrix rows, of the first LDPC matrix.

18. The method of claim 14 further comprising:
to generate the second LDPC matrix via modification of the first LDPC matrix, performing partitioning of a plurality of sub-matrix rows of the first LDPC matrix into a plurality of layers of the second LDPC matrix; and
performing layered Belief Propagation (BP) decoding on the plurality of layers of the second LDPC matrix to decode the second LDPC signal to generate the second estimate of the second information bit encoded therein.

19. The method of claim 14 further comprising:
replacing an all-zero valued sub-matrix within a sub-matrix row of the first LDPC matrix with a CSI (Cyclic Shifted Identity) sub-matrix to generate the second LDPC matrix.

20. The method of claim 14, wherein the communication device is operative within at least one of a satellite communication system, a wireless communication system, a wired communication system, or a fiber-optic communication system.

* * * * *